United States Patent [19]

Lau et al.

[11] Patent Number: 6,124,421

[45] Date of Patent: Sep. 26, 2000

[54] POLY(ARYLENE ETHER) COMPOSITIONS AND METHODS OF MANUFACTURE THEREOF

[75] Inventors: Kreisler S. Y. Lau; Tian-An Chen, both of Sunnyvale; Boris A. Korolev, San Jose; Emma Brouk, Sunnyvale; Paul E. Schilling, Granite Bay; Heike W. Thompson, Mountain View, all of Calif.

[73] Assignee: AlliedSignal Inc., Morristown, N.J.

[21] Appl. No.: 08/990,157

[22] Filed: Dec. 12, 1997

[51] Int. Cl.$^7$ .................................................. C08G 79/02
[52] U.S. Cl. .......................... 528/169; 528/86; 528/125; 528/167; 528/403; 528/410; 528/422; 528/480; 528/491; 528/503; 525/390; 428/411.1; 437/233; 437/234; 437/235
[58] Field of Search .............................. 528/169, 86, 125, 528/167, 403, 410, 422, 480, 491, 503; 437/233, 234, 235; 525/390; 428/411.1

[56] References Cited

U.S. PATENT DOCUMENTS

| | | | |
|---|---|---|---|
| 4,806,618 | 2/1989 | Imai et al. | 528/125 |
| 5,003,178 | 3/1991 | Livesay | 250/492.3 |
| 5,145,936 | 9/1992 | Mercer | 528/86 |
| 5,189,138 | 12/1993 | Trofimenko et al. | 528/125 |
| 5,233,046 | 8/1993 | Hay et al. | 548/257 |
| 5,248,838 | 9/1993 | Massirio et al. | 568/727 |
| 5,268,444 | 12/1993 | Jensen et al. | 528/125 |
| 5,429,995 | 7/1995 | Nishiyama et al. | 437/238 |
| 5,446,204 | 8/1995 | Bryant et al. | 568/333 |
| 5,484,687 | 1/1996 | Watanabe et al. | 430/296 |
| 5,498,803 | 3/1996 | Hergenrother et al. | 568/646 |
| 5,602,060 | 2/1997 | Kobayashi et al. | 437/238 |
| 5,648,448 | 7/1997 | Marrocco, III et al. | 528/125 |
| 5,658,994 | 8/1997 | Burgoyne, Jr. et al. | 525/390 |
| 5,660,920 | 8/1997 | Buckley et al. | 428/209 |
| 5,660,921 | 8/1997 | Ahn et al. | 428/209 |

FOREIGN PATENT DOCUMENTS

| | | | |
|---|---|---|---|
| 0 581 272 A1 | 7/1993 | European Pat. Off. | C07C 25/24 |
| 0755957 A1 | 1/1997 | European Pat. Off. | C08G 65/40 |
| 0 758 664 | 2/1997 | United Kingdom | C08G 65/40 |
| WO 93/09079 | 5/1993 | WIPO | C07C 15/54 |

OTHER PUBLICATIONS

Chemical Abstracts, vol. 118, No. 6, Apr. 19, 1993, Abstract No. 148163, Strukelj, Marco et al., "Novel poly(aryl ethers) from bis(4–fluorophenyl)ethyne" XP02101652.

Chemical Abstracts, vol. 117, No. 26, Dec. 28, 1992, Abstract No. 261070, Yang, Mei et al., "Spectral and lasing properties of new dyes in ultraviolet region", XP002101651.

L. Brandsma et al. Synthetic Communication, vol. 20, No. 12, 1990, pp. 1889–1892, "An efficient and general procedure for the cross–coupling of trimethylsilylacetylene and vinylic aromatic or heteroaromatic bromides.".

*Primary Examiner*—Duc Truong
*Attorney, Agent, or Firm*—Skjerven, Morrill, MacPherson, Franklin and Friel

[57] ABSTRACT

Dielectric compositions encompassing one or more poly (arylene ether) polymers are provided. The dielectric compositions have the repetitive structural unit:

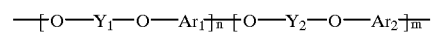

where n=0 to 1; m=0 to 1−n; and $Y_1$, $Y_2$, $Ar_1$ and $Ar_2$ are each a divalent arylene radical, $Y_1$ and $Y_2$ derived from biphenol compounds, $Ar_1$ derived from difluoroarylethynes and $Ar_2$ derived from difluoroaryl compounds. Where both $Y_1$ and $Y_2$ are derived from fluorene bisphenol, n=0.1 to 1. Such poly(arylene ether) polymers are employed with a variety of microelectronic devices, for example, integrated circuits and multichip modules.

45 Claims, 4 Drawing Sheets

POLY(ARYLENE ETHER) COMPOSITIONS AND METHODS OF MANUFACTURE THEREOF

BACKGROUND

SCOPE OF THE INVENTION

The present invention relates generally to poly(arylene ether) compositions and methods of manufacture thereof, and more specifically to poly(arylene ether) polymers that form low dielectric constant, low moisture absorbing and high glass transition temperature dielectric films for microelectronic devices, and methods of manufacture thereof.

RELATED ART

Advances in the semiconductor industry are characterized by the introduction of new generations of integrated circuits (IC's) having higher performance and greater functionality than that of the previous generation. These advances are often the result of reducing the size of the IC devices. However, as device geometries approach and then go beyond dimensions as small as 0.25 micron ($\mu$m), the dielectric constant of an insulating material used between conductive paths, for example silicon oxide ($SiO_2$), becomes an increasingly significant factor in device performance. As the distance between adjacent conductive paths becomes smaller, the resulting capacitance, a function of the dielectric of the insulating material divided by the distance between conductive paths, increases. As a result, capacitive coupling between adjacent conductive paths is increased. The increased capacitance additionally results in increased power consumption for the IC and an increased RC time constant. The latter resulting in reduced signal propagation speed. In addition, the increased capacitance can result in cross talk between adjacent paths, or layers of paths, thus lowering the signal to noise ratio.

Organic insulating materials can provide films having dielectric constants in the range of approximately 2.0–3.0, significantly lower than the 3.9 of a $SiO_2$ film. Thus reduced capacitance is provided and the aforementioned problems alleviated. However, any organic material must meet other criteria in addition to a low dielectric constant before it can be used to replace the commonly employed $SiO_2$. For example, the material should have a glass transition temperature (Tg) of at least 350 degrees Celsius (°C.), good thermal stability to and above the Tg, a low moisture absorption rate and good retention of the storage modulus above the material's Tg.

One attempt at such an organic material and an IC application that uses the material are the subjects of European Patent Application EP 0 755 957 A1, "NONHALOGENATED POLY(ARYLENE ETHERS)," ('957 application), and a related U.S. Pat. No. 5,658,994, "NON-FUNCTIONALIZED POLY(ARYLENE ETHER) DIELECTRICS," ('994 patent), both by Burgoyne, Jr., et al. The '994 patent is directed to "a dielectric material provided on a microelectronic device, wherein the dielectric material contains a poly(arylene ether) polymer" (column 3, lines 25–27). The '957 application, is directed to "the field of poly(arylene ethers) which do not contain any metal-reactive groups in the polymer, such as activated fluorine substituents." (page 2, lines 1–2). The poly(arylene ethers) of the '957 application appear to be the dielectric material of the '994 patent. However, the poly(arylene ethers) of Burgoyne Jr., et. al., among other things, have glass transition temperatures below 300° C. (Table 3 in the '957 application) which can be problematic during commonly employed Chemical Vapor Depositions of tungsten at 450° C. In addition, Burgoyne, Jr., et al. suggests the use of adhesion promoters with the poly(arylene ethers) of the '994 patent (see column 9, lines 41–50). However, the use of adhesion promoters, such as the hexamethyldisilazane suggested by Burgoyne, Jr., et al. typically require an additional process step and often result in an increase in the amount of outgassing from the polymer film hence, lower thermal stability.

Another example of an organic material for use as a dielectric material is a family of fluorinated poly(arylene ethers) having dielectric constants in the range of 2.36–2.65. These fluorinated poly(arylene ethers) are described in U.S. patent application, Ser. No. 08/665,189 ('189 application) filed Jun. 14, 1996, now U.S. Pat. No. 5,959,157. The '189 application is entitled "IMPROVED POLY(ARYLENE ETHER) COMPOSITIONS AND THE METHOD FOR THEIR MANUFACTURE" and assigned to the assignee of the present application. However, while the polymers of the '189 application have acceptably low dielectric constants and high Tg, adhesion of these polymers to common semiconductor surfaces, without the use of adhesion promoters, is at times problematic.

Thus it would be desirable to manufacture and use an organic dielectric material having a Tg value above 350° C. and preferably above 400° C. It would also be desirable for the organic dielectrics manufactured to have good adhesion to a variety of common semiconductor surfaces without the use of adhesion promoters. In addition, it would be desirable for the organic dielectrics to have good gap-filling qualities and thus completely fill spaces between conductive traces of 0.25 $\mu$m or less. Additionally, it would be desirable to manufacture and use an organic dielectric material having good dimensional stability above the dielectric material's Tg, e.g. storage modulus. It would further be desirable for the organic dielectrics to have good thermal stability, as evidenced by little or no outgassing and low moisture absorptivity up to and beyond the Tg. For use as an interlayer dielectric in a multilevel metal construct, it would be desirable for the organic film to additionally be stable toward a variety of common etching and CMP (chemical mechanical polishing) processes. It would further be desirable for the organic dielectrics manufactured to be easily applied in high yield to substrates, for example using standard spin-bake-cure processing techniques, thus insuring their cost effectiveness. Finally, it would be desirable for the organic dielectrics manufactured to also be applicable to use in other microelectronic devices in addition to ICs, for example printed circuit boards (PCBs), multichip modules (MCM's) and the like.

SUMMARY

In accordance with this invention some poly(arylene ethers) are provided having repeating units of the structure:

Formula I

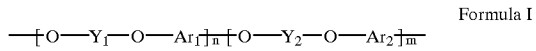

wherein n=0 to 1; and m=1−n; and wherein $Y_1$, $Y_2$, $Ar_1$ and $Ar_2$ are each a divalent arylene radical; $Y_1$ and $Y_2$ are each selected from a first group of divalent arylene radicals, $Ar_1$ is selected from a second group of divalent radicals and $Ar_2$ is selected from a third group of divalent arylene radicals; the first group of divalent arylene radicals consisting of:

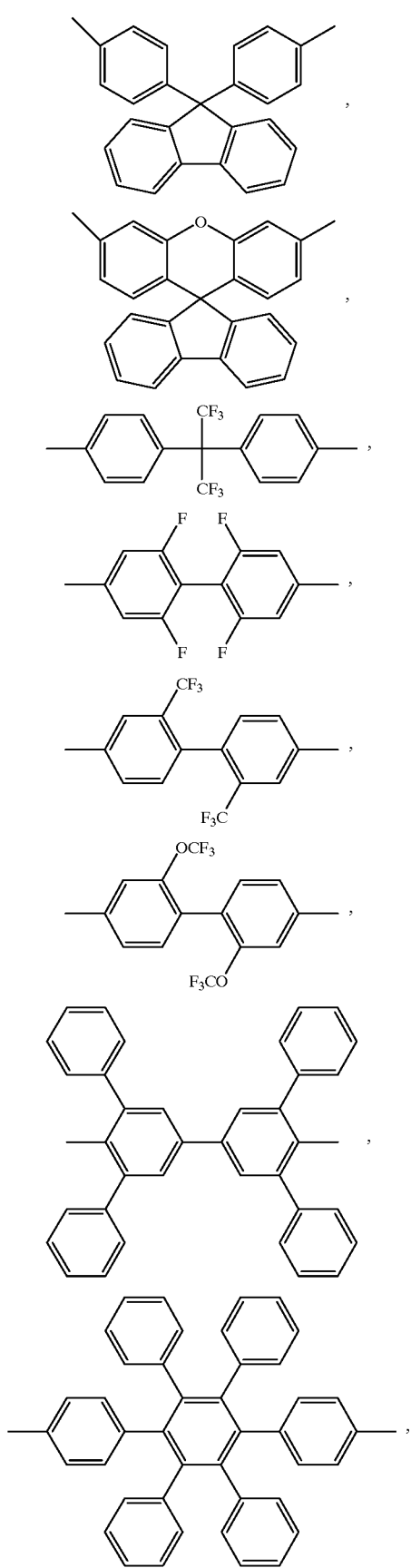
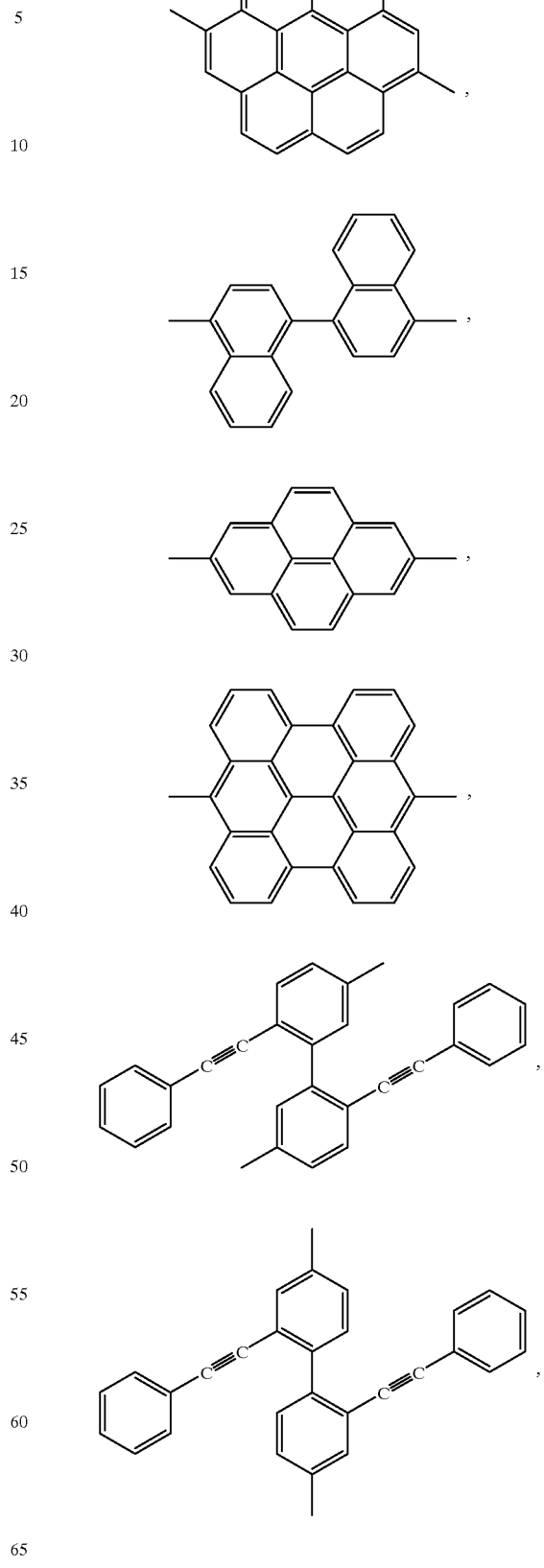

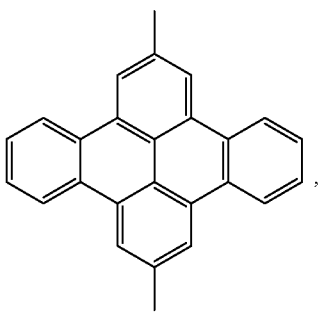
and mixtures thereof; the second group of divalent arylene radicals consisting of:
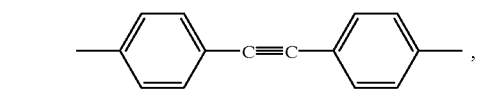
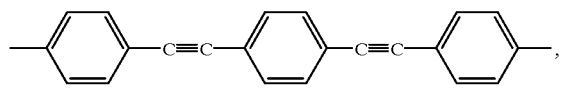
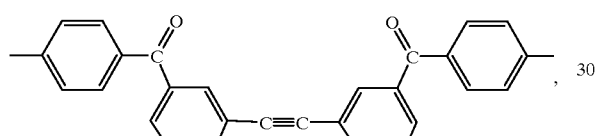
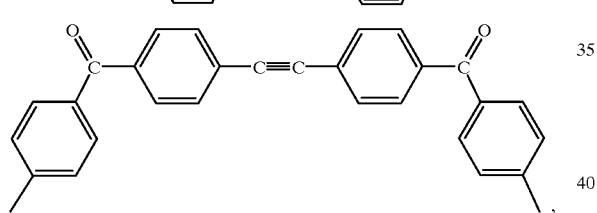
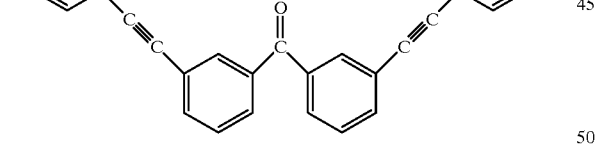
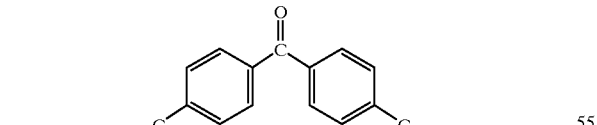
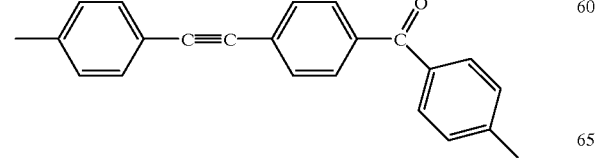
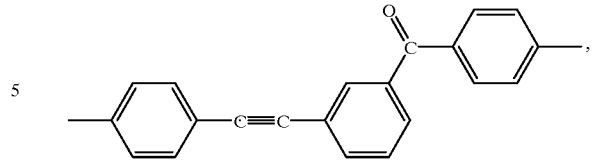
and mixtures thereof; and the third group of divalent arylene radicals consisting of:
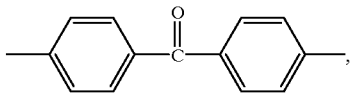
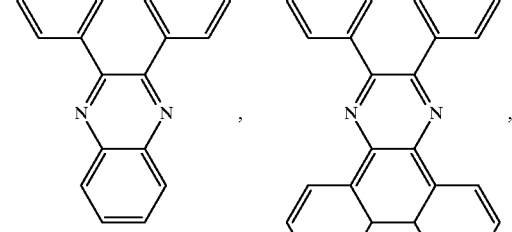
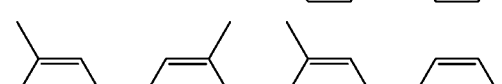
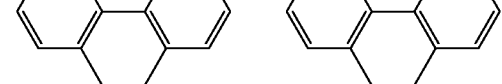
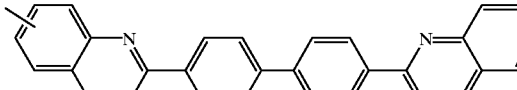
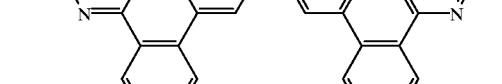
and mixtures thereof. In some embodiments of the present invention where $Y_1$ and $Y_2$ are both derived from fluorene bisphenol, n=0.1 to 1.

Additionally, in accordance with some embodiments of the present invention, processes for producing poly(arylene ethers) having the structure of Formula I are provided, wherein the divalent arylene radicals $Y_1$ and $Y_2$ are each individually selected from the above first group of divalent arylene radicals, and divalent arylene radicals $Ar_1$ and $Ar_2$ are selected from the above second and third groups of divalent arylene radicals, respectively; wherein a reaction mixture is provided by charging a reaction vessel with the monomers corresponding to the divalent arylene radicals $Y_1$, $Y_2$, $Ar_1$ and $Ar_2$, respectively, and an azeotropic solvent; polymerizing the monomers by refluxing the reaction mixture and removing a portion of the azeotropic solvent during the polymerization. In some embodiments of the present invention, processes for producing poly(arylene ethers) of the present invention are provided wherein some of the divalent arylene radicals $Y_1$, $Y_2$, $Ar_1$ and $Ar_2$, respectively, and an azeotropic solvent are pre-reacted to form block polymer structures.

A microelectronic device, in accordance with this invention is also provided wherein a dielectric layer is disposed overlying a surface and wherein the dielectric layer encompasses a poly(arylene ether) having the structure of Formula I, wherein divalent arylene radicals $Y_1$ and $Y_2$ are each selected from the above first group of divalent arylene radicals, and divalent arylene radicals $Ar_1$ and $Ar_2$ are selected from the above second and third groups of divalent arylene radicals, respectively.

In accordance with the present invention a method for synthesizing bis(4-fluorophenyl)ethyne is also provided, wherein a first reaction mixture is formed by charging a first reaction vessel with a 1-halo-4-fluorobenzene, an ethynyltrialkylsilane a first catalyst and a solvent to provide a first reaction mixture; heating the first reaction mixture to provide 1-fluoro-4-(trialkylsilyl)ethynylbenzene; desilylating the 1-fluoro-4-(trialkylsilyl)ethynylbenzene with a weak base to provide 1-ethynyl-4-fluorobenzene; charging a second reaction vessel with a second 1-halo-4-fluorobenzene, the 1-ethynyl-4-fluorobenzene, and a second catalyst; and heating second reaction mixture to provide the bis(4-fluorophenyl)ethyne.

In accordance with some embodiments, the poly(arylene ethers) of the present invention encompass a number of different polymer designs. These polymer designs include, among other things, a variety of homopolymers, block or random copolymers and polymer blends. Some embodiments in accordance with the present invention include methods of making poly(arylene ethers) that encompass the aforementioned number of different polymer designs. Some of the aforementioned different polymer designs, in accordance with the present invention, encompass divalent arylene radicals selected singly or in combination with another divalent arylene radical to provide specific characteristics to the poly(arylene ethers) formed therefrom. Some embodiments of the present invention encompass methods of making monomers to provide the aforementioned divalent arylene radicals.

In addition, some embodiments of the present invention are provided that encompass methods of forming a dielectric material. In some embodiments the dielectric material is formed as a film on a substrate, for example a semiconductor substrate. In some embodiments, the dielectric material is formed as an encapsulant, for example in a multichip module. In some embodiments the dielectric material formed has excellent thermal stability as characterized, among other things by, glass transition temperature and outgassing. In some embodiments the dielectric material, formed as a film, is an excellent dielectric layer for a multilevel metal structure in a microelectronic device, for example an integrated circuit or a multichip module, and as characterized by, among other things, excellent thermal stability, degree of planarization, dielectric constant and gap-fill capability.

BRIEF DESCRIPTION OF THE DRAWINGS

The present invention may be better understood, and its numerous objects, features, and advantages made apparent to those skilled in the art by referencing the accompanying drawings.

DETAILED DESCRIPTION

Poly(arylene ethers) in accordance with the present invention have repeating units of general Formula I:

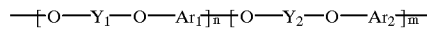

where n=0 to 1; m=1−n; and $Y_1$, $Y_2$, $Ar_1$ and $Ar_2$ are each a divalent arylene radical. While each of divalent arylene radicals $Y_1$ and $Y_2$, can each be a unique compound of the appropriate formula described below, preferred embodiments of the present invention employ the same arylene radical for both $Y_1$ and $Y_2$. In embodiments where $Y_1$ and $Y_2$ are each derived from fluorene bisphenol, it has been found advantageous for n=0.1 to 0.9 and m=1−n. In addition, poly(arylene ethers) in accordance with the present invention are free, in final form, of reactive carbon to fluorine bonds. Poly(arylene ethers), in accordance with the present invention, can be homopolymers consisting essentially of a single segmented structure, n or m, of the above repeat unit. Poly(arylene ethers) can also be copolymers having segmented structures of the above repeat unit formed in an essentially random arrangement. In addition, poly(arylene ethers) of the present invention can comprise block polymer repeat units where, as known, each block polymer is a repeat unit of two or more segmented structures, either n or m, such block polymer units encompassing all or portions of the poly(arylene ether) polymers. Poly(arylene ethers) in accordance with the present invention can also be polymer blends where a different kind of repeat unit is used in combination with the above mentioned repeat unit. However, where such polymer blends are employed, at least about 60 Mol % and preferably at least about 80 Mol % of the repeat units should be the above-mentioned repeat unit.

Divalent arylene radical $Ar_1$ is advantageously derived from difluoro diarylacetylenes and ethynylated benzophenones of a general Formula II:

F—Ar₁—F  Formula II and where $Ar_1$ is an aromatic moiety that imparts, among other things, a high Tg to the final polymer. Some compounds of Formula II can be readily synthesized by one of ordinary skill in the art without undue experimentation. Details of reactions useful in the synthesis of these compounds are found in, for example, M. Paventi, E. Elce, R. J. Jackman, and A. S. Hay, Tetrahedron Letters, 33(43), 6405–6406 (1992); M. Yang, X. Huang, H. Wang, Z. Yu, Y. Zhou, and J. Pan, Zhongguo Jiguang, 19(8), 593–7 (1992); A. Bader, and D. $Ar_1$ t, U.S. Pat. No. 5,185,454 (930209); Chem Abstr 93, 10635 (1993) and U.S. Pat. No. 5,233,046 issued to Hay et al. Examples of divalent radicals derived from suitable difluoro compounds of general Formula II include, but are not limited to:

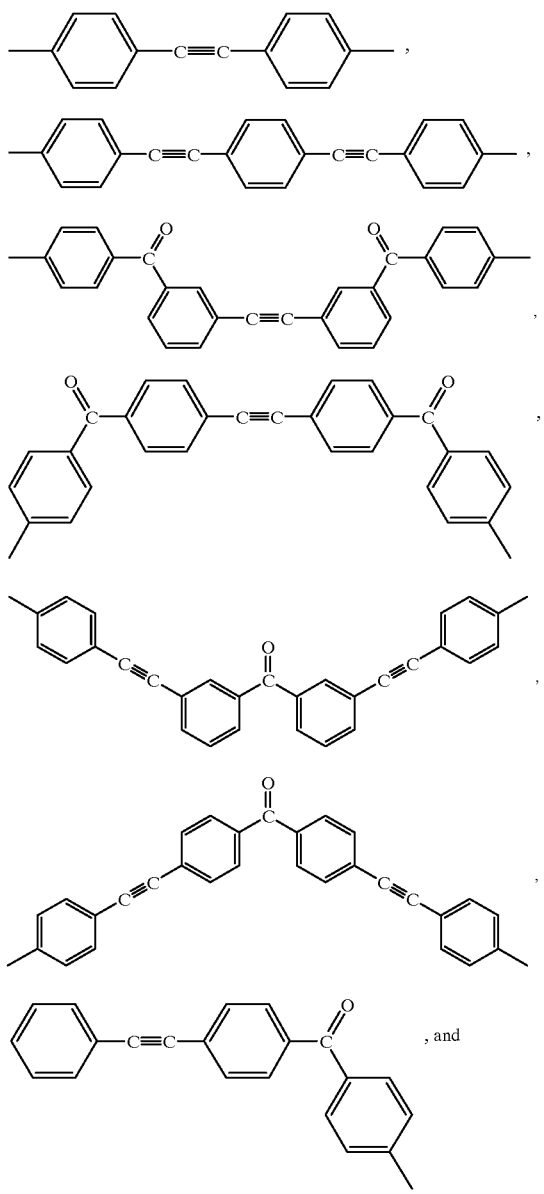

Preferred difluoro compounds in accordance with formula II are:

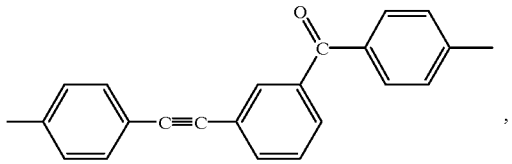

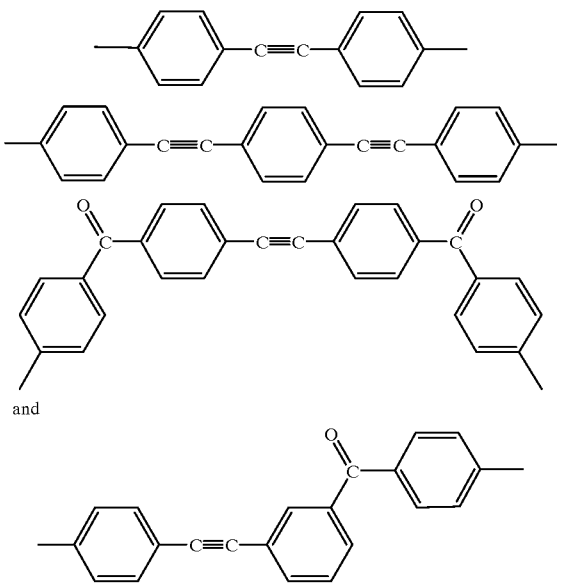

and with bis(4-fluorophenyl)ethyne being the most preferred.

Figure 1:
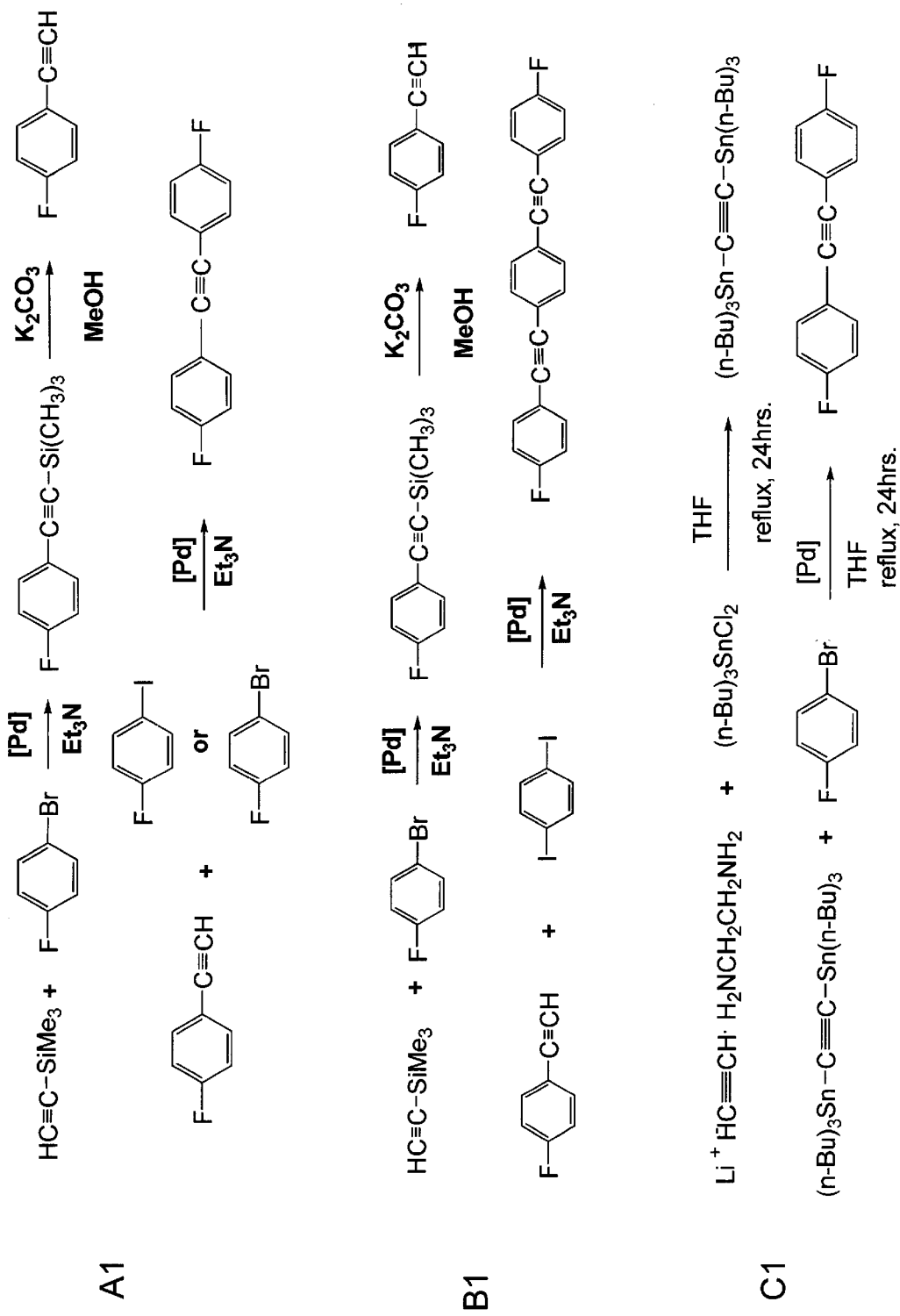
FIG. 1 depicts a method for the synthesis of bis(4-fluorophenyl)ethyne (BFPE) and 1,4-bis(4-fluorophenylethynyl)benzene (BFPEB) in accordance with an embodiment of the present invention.

Referring to FIG. 1, advantageous synthetic routes for the formation of both bis(4-fluorophenyl)ethyne (BFPE) and 4,4'-bis(4-fluorophenylethynyl)benzene (BFPEB) are shown in accordance with embodiments of the present invention. For example, in synthetic route 'A1' of FIG. 1, BFPE is prepared by coupling commercially available 4-bromofluorobenzene with ethynyltrimethylsilane in the presence of an appropriate palladium[0] catalyst in triethylamine (TEA). A reaction vessel is charged with the reagents, catalyst and solvent and heated in an inert atmosphere to approximately 80° C. for about 2 h with stirring. The reaction mixture is cooled to about 50° C. and stirred for about an additional 2 h. Heating is stopped and the reaction mixture allowed to cool to ambient, with stirring continued for about an additional 24 h. An intermediate is obtained and desilylated with a weak base to form 1-ethynyl-4-fluorobenzene.

In some embodiments, the 1-ethynyl-4-fluorobenzene is subsequently coupled with 4-bromo-fluorobenzene in a manner analogous to the first coupling reaction of route 'A1' to provide BPFE. In some embodiments, 4-iodo-fluorobenzene is employed in place of 4-bromo-fluorobenzene to obtain BPFE. After purification, white needles having a melting point of 95–96 degrees Celsius (°C.) are obtained.

Still referring to FIG. 1, synthetic route 'B1' advantageously depicts producing 4,4'-bis(4-fluorophenylethynyl)benzene in a manner analogous to route 'A1', above. As indicated in FIG. 1, only the second coupling reaction is changed, wherein 1,4-diiodobenzene is coupled with two equivalents of 1-ethynyl-4-fluorobenzene to provide BFPEB. After purification, white crystals having a melting point of 207–209° C. are obtained.

In synthetic route 'C1' of FIG. 1, an alternate two step process for preparing BFPE consistant with the route in Sutherlin et al., *Macromolecules*, v.19, p.1260–1265 (1986) is shown. The first step is coupling commercially available tri-n-butyltin chloride (Aldrich Chemicals, Milwaukee, Wis.) with lithium acetylide ethylenediamine complex. These precursors are heated to reflux in anhydrous tetrahydrofuran (THF) under an argon blanket to form bis(tri-n-butylstannyl)ethyne. The THF solution of bis(tri-n-butylstannyl)ethyne is subsequently washed and then dried over anhydrous sodium sulfate.

The second step is the coupling of bis(tri-n-butylstannyl) ethyne with commercially available 4-bromofluorobenzene in the presence of a palladium[0] catalyst. The 4-bromofluorobenzene and previously prepared palladium [0] catalyst are dissolved in anhydrous THF and added to the previously prepared bis(tri-n-butylstannyl)ethyne. The reaction mixture formed is heated to reflux for about 60 h in an inert atmosphere. The reaction mixture is then chilled to provide off-yellow crystals having a melting point of 95–96° C.

Divalent arylene radical $Ar_2$ is advantageously derived from difluoro benzophenones, phenyl quinoxalines and bis (phenyl quinoxalines) having general Formula III:

F—Ar$_2$—F    Formula III and where $Ar_2$ is an aromatic moiety that imparts, among other things, excellent adhesion, gapfill capability and low outgassing to the final polymer. The difluoro benzophenones of Formula III are commercially available or readily synthesized by one of ordinary skill in the art without undue experimentation. For example, 4,4'-difluorobenzophenone is available from Aldrich of Milwaukee, Wis. Examples of divalent radicals derived from suitable difluoro compounds of general Formula III include, but are not limited to:

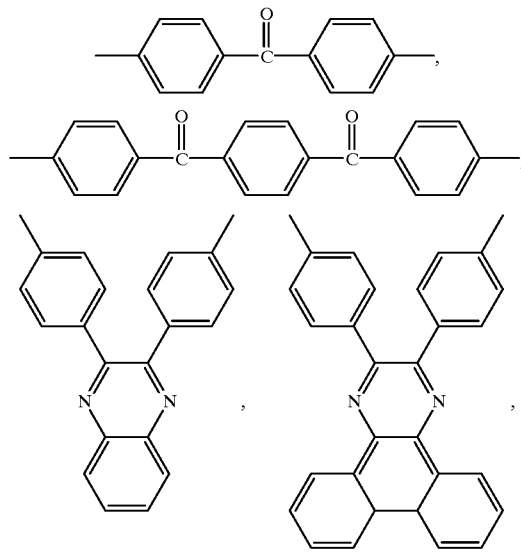

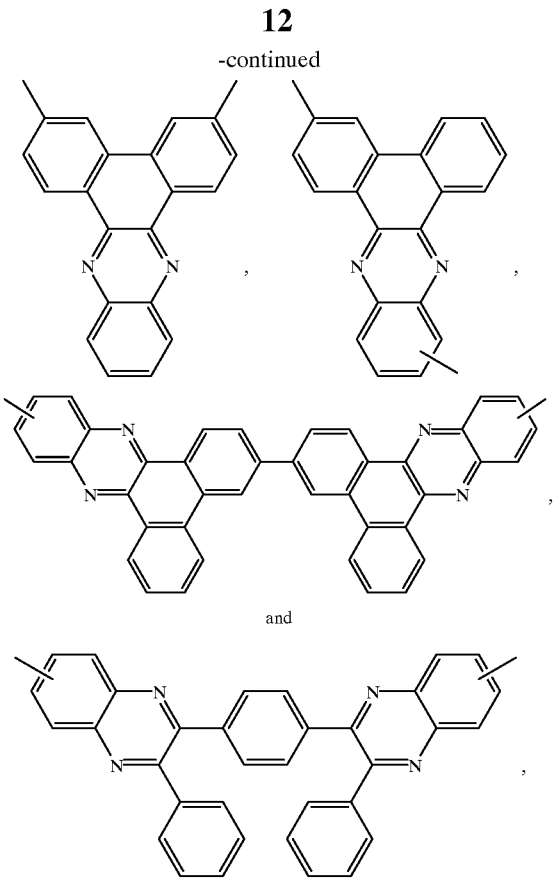

and

Preferred difluoro compounds in accordance with formula III are:

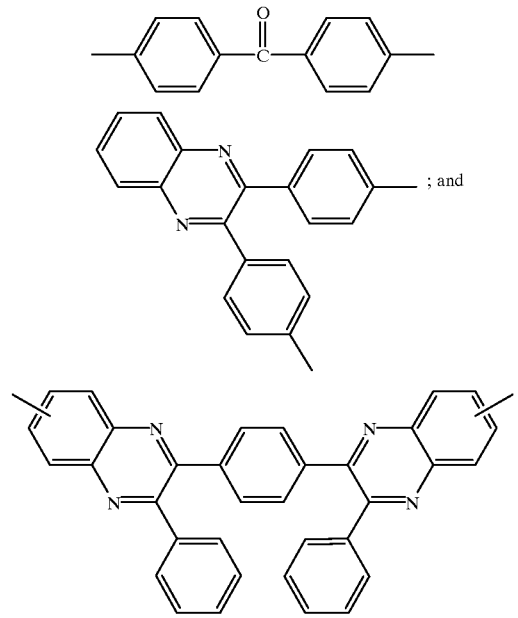

with 4,4'-difluorobenzophenone being the most preferred.

Figure 2:
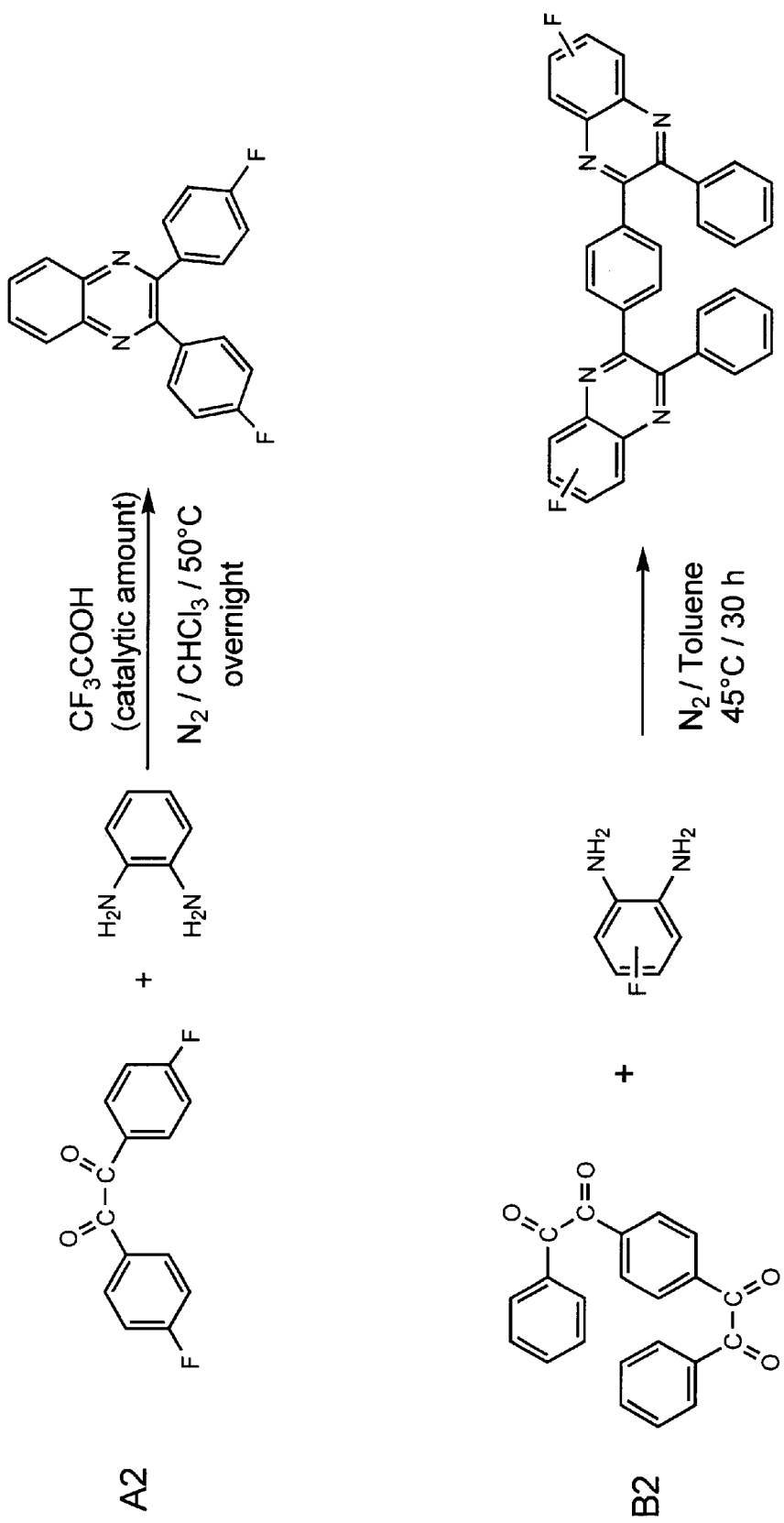
FIG. 2 depicts a method for the synthesis of 2,3-bis(4-fluorophenyl)-quinoxaline (BFPQ) and an isomeric mixture of 6, 6' and 6,7'-difluoro-1,4-bis(3-phenylquinoxalin-2-yl)benzenes (DFBPQBs)

Turning now to FIG. 2 a method for the synthesis of 2,3-bis(4-fluorophenyl)quinoxaline and an isomeric mixture of 6, 6' and 6,7'-difluoro-1,4-bis(3-phenylquinoxalin-2-yl) benzenes in accordance with embodiments of the present invention is depicted. The 2,3-bis(4-fluorophenyl)

quinoxaline is the result of condensing 1,2-phenylenediamine with 4,4'-difluorobenzil and the isomeric mixture of 6,6' and 6,7'-difluoro-1,4-bis(3-phenylquinoxalin-2-yl)benzenes is the result of condensing 4-fluoro-1,2-diaminobenzene with 1,4-bis(phenylglyoxaloyl)benzene.

For example, in synthetic route 'A2' of FIG. 2, 4,4'-difluorobenzil, 1,2-phenylenediamine and chloroform are charged together in a reaction vessel and stirred. A catalytic amount of trifluoroacetic acid is added slowly and the reaction mixture heated to about 50° C. with continued stirring. After about 16 h, the mixture is cooled to provide 2,3-bis(4-fluorophenyl)quinoxaline after removal of the chloroform. Recrystallization results 2,3-bis(4-fluorophenyl)quinoxaline having a melting point of 127–1290° C.

In synthetic route 'B2' of FIG. 2, 1,4-bis(phenylglyoxaloyl)benzene is added slowly to a toluene solution of 4-fluoro-1,2-diaminobenzene maintained at about 45° C. in an inert atmosphere. After the addition is complete, the mixture is stirred for about 30 h, cooled and the toluene removed. The solid obtained is purified to provide an isomeric mixture of 6,6' and 6,7'-difluoro-1,4-bis(3-phenylquinoxalin-2-yl)benzenes having a melting point of 238–240° C.

Divalent arylene radicals $Y_1$ and $Y_2$ are both advantageously derived from hydroxy-substituted aromatic (bisphenol) compounds of a general Formula IV:

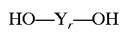

Formula IV where $Y_r$ represents either $Y_1$ or $Y_2$ and is an aromatic moiety that in combination with $Ar_1$ or $Ar_2$ imparts, among other things, a high Tg to the final polymer. Such materials are either commercially available and/or are readily synthesized by one of ordinary skill in the art. For example, 9,9'-bis(4-hydroxyphenyl)fluorene (fluorene bisphenol) is commercially available from Nippon Steel, Tokyo, Japan. In addition, the synthesis of several fluorene bisphenol compounds are described in P. W. Morgan, *Macromolecules,* Vol. 3, p. 536 (1970) and U.S. Pat. No. 5,248,838 issued to Massirio et al. Examples of suitable groups for Yr include, but are not limited to:

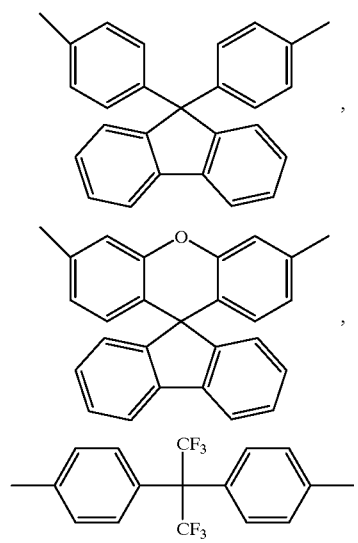

-continued

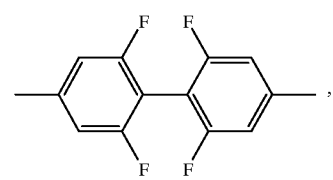

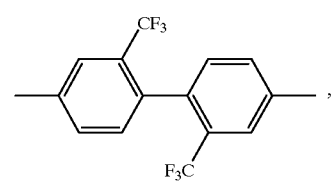

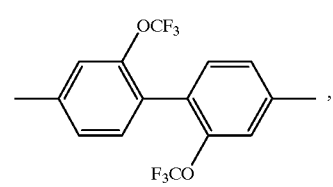

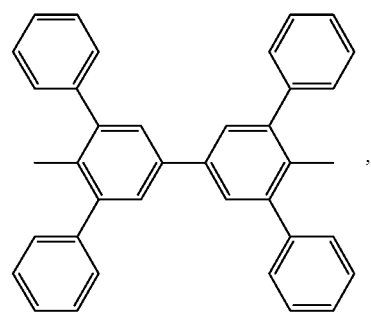

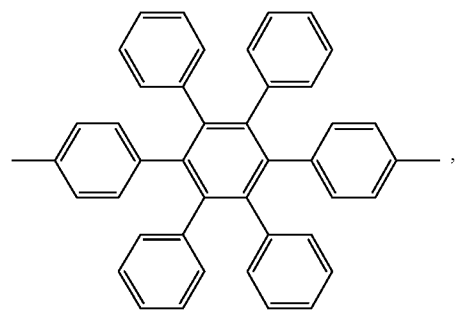

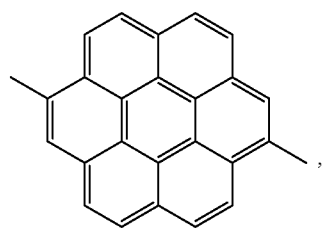

-continued

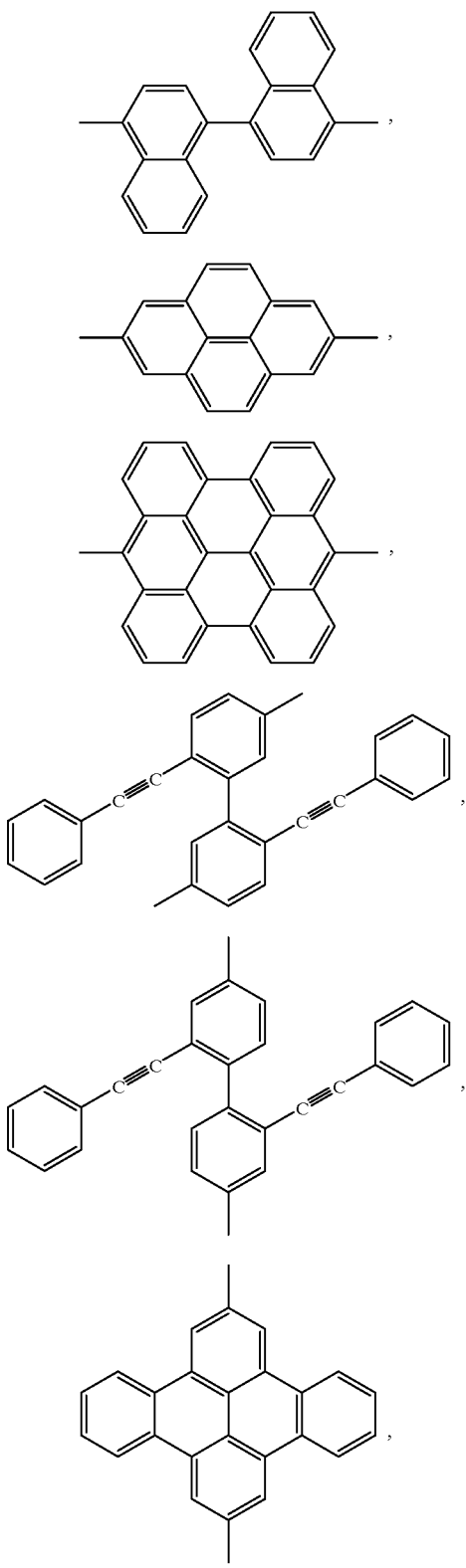

Preferred bisphenol compounds in accordance with formula IV are:

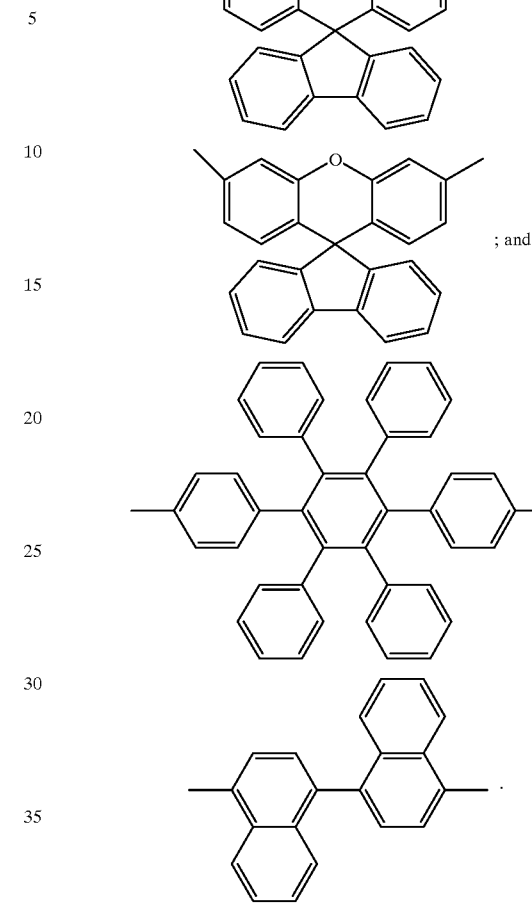

with 9,9'-bis(4-hydroxyphenyl)fluorene being the most preferred.

Figure 3:
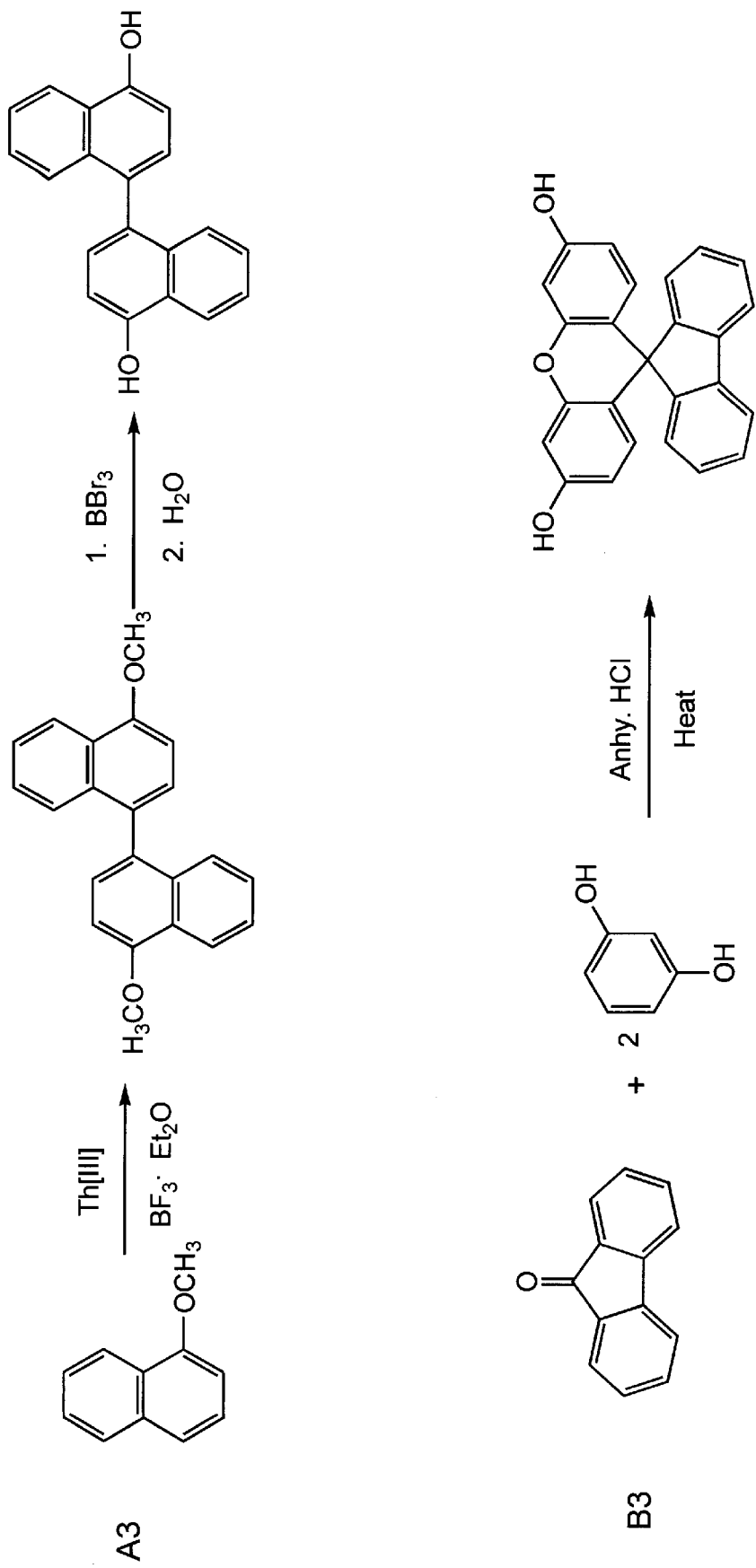
FIG. 3 depicts a method for the synthesis of 2,7-dihydroxy-spiro(9',9'-fluorene-10,10-xanthene) (DHSFX) and 4,4'-dihydroxy-1,1'-binaphthyl (DHBN) in accordance with an embodiment of the present invention.

Turning now to FIG. 3 a method for the synthesis of both xanthene fluorene diol (2,7-dihydroxy-spiro(9',9'-fluorene-10,10-xanthene) and 1,1'-binaphthyldiol (4,4'-dihydroxy-1,1'-binaphthyl) in accordance with embodiments of the present invention is depicted. The xanthene fluorenediol is the result of, for example, condensing fluorene with resorcinol; the 1,1'-binaphthyldiol is the result of, for example, a thallium[III] trifluoroacetate (TTFA)-mediated oxidative coupling of 1-methoxynaphthalene.

In synthetic route 'B3' of FIG. 3, fluorene and resorcinol are charged to a reaction vessel and heated to the molten state. Gaseous, anhydrous hydrogen chloride is passed through the melt for approximately 3 to 5 h and the melt cooled. The resulting solids are washed and extracted into a solvent. After purification small white crystals of xanthene fluorene diol having a melting point of 270–271° C. are obtained.

In synthetic route 'A3', 1-methoxynaphthalene and a solution of tris(trifluoroacetato)thallium[III] in acetonitrile are charged to a reaction vessel. Boron trifluoride etherate is added and the reaction mixture stirred at room temperature for between approximately 1–2 h to provide the intermediate 4,4'-dimethoxy-1,1'-binaphthyl. The 4,4'-dimethoxy-1,1'-binaphthyl intermediate is subsequently demethylated using boron tribromide (BBr$_3$) which is added slowly to a dichloromethane solution of the intermediate to maintain the temperature at about −78° C. The reaction mixture is then warmed to room temperature and stirred for approximately 16 h in an inert atmosphere, then poured into water. The white crystals that form are 4,4'-Dihydroxy-1,1'-binaphthyl.

Figure 4:
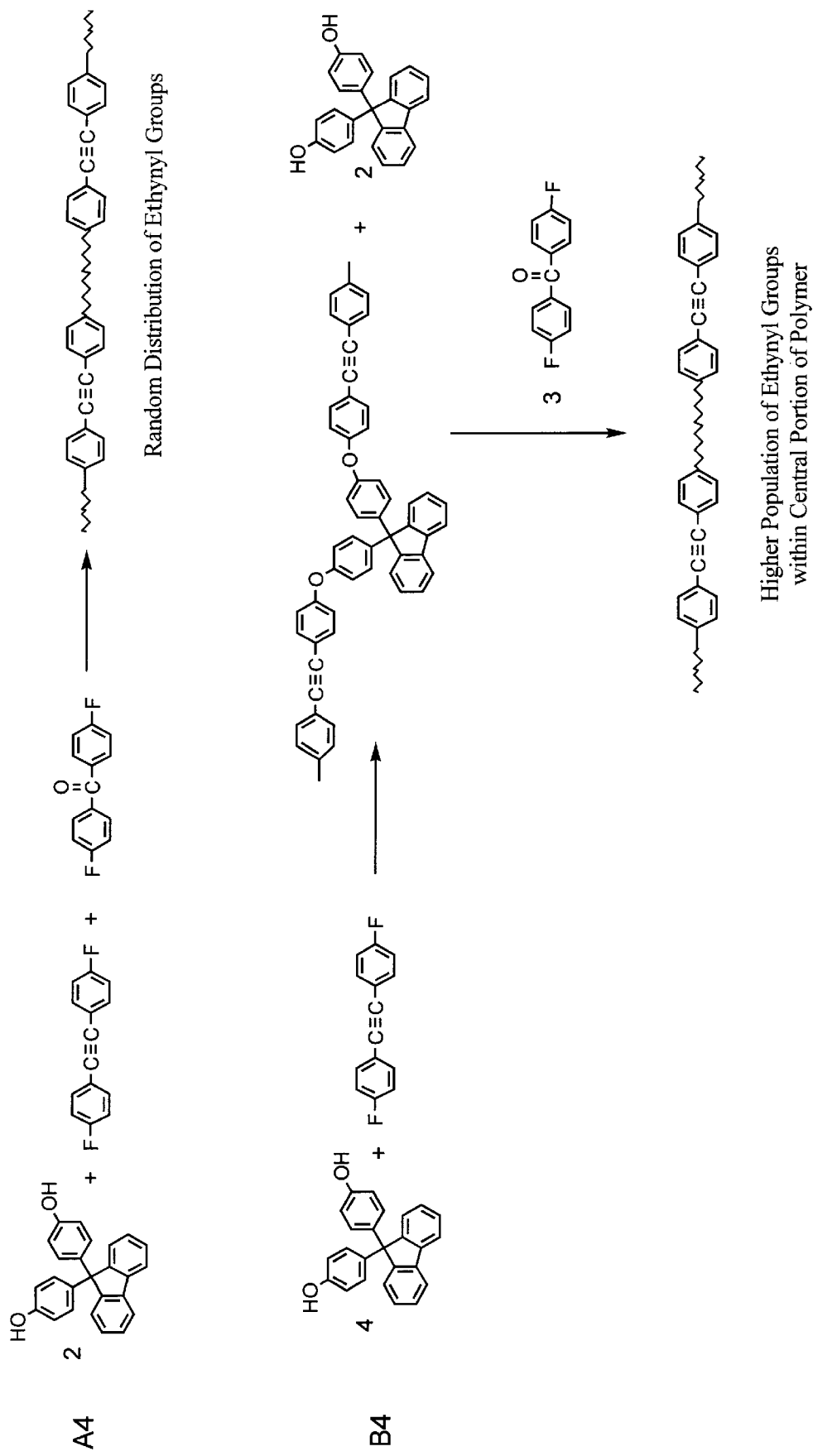
FIG. 4 depicts methods for the synthesis of poly(arylene ethers) in accordance with embodiments of the present invention.

The poly(arylene ethers) of Formula I are generally synthesized by coupling two equivalents of bisphenol compounds $Y_1$ and $Y_2$ ($Y_r$) of Formula IV with one equivalent each of a difluoro compound, $Ar_1$, of Formula II and one equivalent of a difluoro compound, $Ar_2$, of Formula III as depicted in synthetic route 'A4' of FIG. 4. The simultaneous coupling of these compounds advantageously results in an essentially random order of copolymers to form the backbone of the poly(arylene ether) of Formula I. Thus an appropriately sized reaction vessel, equipped with for example, stirring, a reflux condenser, an appropriate azeotropic distillation trap, e.g. a Dean-Stark trap, and a thermocouple, is provided. The reaction vessel contains a sufficient quantity of a first solvent, e.g. sulfolane, maintained at between an appropriate temperature, e.g. 80–100° C. The reaction vessel, is then charged with an appropriate amount of one or more compounds of Formula IV, and appropriate amounts of compounds with Formula II and Formula III, respectively. To this mixture, an appropriate amount of an anhydrous carbonate (e.g. potassium carbonate) is added, washed with appropriate amounts of the first solvent and an optional second solvent. For example, where the first solvent is sulfolane, an appropriate second solvent is toluene. The reaction mixture is heated to begin azeotropic distillation. Thus for a sulfolane/toluene solvent system, the azeotropic distillate will first be the toluene/water azeotrope. The azeotropic distillation is continued for 2 h to completely remove all traces of water present in the solvents and initially formed in the reaction. The temperature is then advantageously increased by removal of the distillate of the second solvent to provide the crude polymer of Formula I. It should be noted that azeotropic distillation is advantageously used to provide both an anhydrous reaction mixture and a sufficiently high reaction temperature to essentially overcome differences in the reaction rate of the compounds of Formula II and III with the compound of Formula IV. In this manner an essentially random combination of the segmented structures n and m is achieved. The reaction mixture is diluted with an appropriate aprotic solvent, e.g. N-methylpyrrolidinone (NMP), filtered hot and precipitated in an excess of, for example, methanol. The precipitate is isolated, washed and dried to constant weight to provide a pure poly(arylene ether), typically in excess of 95%.

In synthetic route 'B4" of FIG. 4, a method for producing a poly(arylene ether), in accordance with embodiments of the present invention, having block polymer portions is depicted. In a first step, a reaction mixture encompassing appropriate monomers of Formula II and Formula IV, respectively, are pre-reacted for a first time period, e.g. 2 h. After this first time period, the reaction mixture is charged with appropriate monomers of Formula III and Formula IV, respectively, and reacted for a second time period, e.g. 20 h. This pre-reaction provides for forming a quantity of a block polymer structure prior to a more general reaction, analogous to that described for 'A4'. In this manner the backbone of repeating units is modified, so that the repeating units of Formula I are not random. Rather a higher concentration of monomers of Formula II are positioned internally thus providing for additional control of cross-linking at the reactive ethynyl site characteristic of monomers of Formula II.

For one preferred embodiment of the present invention, n=m, $Y_1$ and $Y_2$ are 9,9'-bis(4-hyroxyphenyl)-fluorene and $Ar_1$ and $Ar_2$ are BFPE (bis(4-fluorophenyl)ethyne) and 4,4'-difluorobenzophenone, respectively. In another preferred embodiment, n=0.25 and m=0.75, $Y_1$ and $Y_2$ are 9,9'-bis(4-hyroxyphenyl)-fluorene and $Ar_1$ and $Ar_2$ are BFPE (bis(4-fluorophenyl)ethyne) and 4,4'-difluorobenzophenone, respectively. In yet another preferred embodiment, n=m, $Y_1$ and $Y_2$ are 9,9'-bis(4-hyroxyphenyl)-fluorene and $Ar_1$ and $Ar_2$ are BFPE (bis(4-fluorophenyl) ethyne) and 2,3-bis(4-fluorophenyl)quinoxaline, respectfully. In some of these aforementioned preferred embodiments, monomers $Y_1$ and/or $Y_2$ and monomer $Ar_1$ are pre-reacted.

Poly(arylene ether) compositions of the present invention are used as layers, coatings or encapsulants, and substrates for microelectronic devices, for example, integrated circuits (ICs), printed circuit boards (PCBs), microelectronic modules (MEMs) and the like. Generally, polymers in accordance with the present invention are used as dielectric or insulating layers, however, the polymers also provide mechanical strength. Thus, poly(arylene ethers) in accordance with the present invention are disposed between layers of conductive paths or as a passivation layer overlying a layer of conductive paths in ICs, PCBs and MEMs.

Some embodiments of poly(arylene ethers) in accordance with the present invention are used as interlayer dielectrics between one or more metal layers in ICs having mutlilayer metal structures. In addition, such interlayer dielectrics that encompass embodiments of the present invention, advantageously provide electrical isolation between adjacent conductive paths. As previously mentioned, current IC devices often have device geometries as small as 0.25 $\mu$m or smaller. The next generation of IC devices may have geometries of 0.13 $\mu$m or smaller. Typically these small geometries result in spaces between structures, gaps, that are also as small as the smallest device geometry employed. Thus, for a material to electrically isolate adjacent conductive paths from one another, the material should fill these spaces or gaps between the adjacent conductive paths.

Where a silicon oxide dielectric is used, often specially designed equipment and/or processes need be used to fill these small gaps. Advantageously, embodiments of the present invention are designed to have good gap-filling characteristics, alleviating the need for such special equipment and/or processes. It has been unexpectedly found that incorporation of divalent radicals derived from benzophenones, phenyl quinoxalines and bis(phenyl quinoxalines), as previously described with respect to $Ar_2$, provide gap-filling capability for 0.25 $\mu$m or smaller gaps.

IC devices having multilayer metal structures often employ a tungsten (W) plug process for interconnection between adjacent layers of metal paths. Typically, such W plugs are formed using chemical vapor deposition techniques that require heating the semiconductor substrate to approximately 450° C. Thus, where an organic dielectric is employed for the interlayer dielectric material, it should retain its integrity at such temperatures. Advantageously, embodiments in accordance with the present invention are designed to have excellent thermal stability and a high Tg. It has been found that incorporation of divalent radicals derived from diarylacetylenes and ethynylated benzophenones, as previously described with respect to $Ar_1$, provide such thermal stability and Tg. Embodiments of the present invention have Tg's in excess of 350° C. and some embodiments have Tg's in excess of 400° C.

It has been found that combination of radicals in accordance with those described for $Ar_1$ and $Ar_2$ when additionally combined with radicals in accordance to those described with respect to $Y_1$ and $Y_2$ form poly(arylene ethers) that retain the performance characteristics described for $Ar_1$ and $Ar_2$. It has also been found that in some embodiments of the present invention, combinations of specific radicals of either $Ar_1$ and $Ar_2$ with other specific radicals of $Y_1$ and $Y_2$ have enhanced performance characteristics with respect to any individual component on its own. Thus embodiments of the present invention have excellent thermal stability, high Tg, high retention of storage modulus, low dielectric constant and gap-filling capability.

It has advantageously been found that pre-reacting $Ar_1$ monomers with one or more Yr monomers alters the final cross-linking distribution of the polymer during the cure process. Thus, such pre-reaction results in an increased concentration of the structural pair $Ar_1/Y_1$ towards the central portion of the polymer rather than the ends of the polymer. Thus poly(arylene ether) polymers with higher thermal stability due to reduced outgassing are provided.

It has been found that incorporation of flexible moieties, such as ether linkages between adjacent radicals, and carbonyl groups within the radicals themselves, provide both flexibility to the resulting poly(arylene ether). In addition, the ether and carbonyl moieties provide coupling sites that result in excellent adhesion to typical semiconductor surfaces. Thus embodiments in accordance with the present invention do not require adhesion promoters for bonding. Such embodiments provide adhesion in excess of 8 ksi (thousands of pounds per square inch) to typical semiconductor surfaces, e.g. comprising silicon, silicon oxide, aluminum and the like.

It has also advantageously been found that the above described flexible moieties additionally provide for unexpectedly low viscosities and enhanced flow characteristics. Thus, embodiments of the present invention provide excellent planarization capability for IC devices. Often, no other planarization technique need be employed, for example, chemical mechanical polishing (CMP). However, where such CMP polishing is desired, for example, in conventional subtractive aluminum process and the alternative damascene/dual damascene processing, embodiments of the present invention provide the hardness necessary to enable such CMP processes.

The advantages of embodiments of the present invention are evidenced by, among other things, the excellent thermal behavior exhibited. It is seen that the weight loss of typical poly(arylene ether) films, in accordance with the present invention, is less than 1% after 90 minutes at 450° C.

Films or layers of poly(arylene ether) polymers, prepared in accordance with embodiments of the present invention, exhibit negligible hysteresis during thermal cycling between 25 to 450° C. Thus, stress in film made of poly(arylene ether) polymers in accordance with the present invention, transition from tensile to compressive as temperature is increased from 25° C. and from compressive to tensile as the same film is cooled from 450° C. As known by one of ordinary skill in the semiconductor arts, films that exhibit compressive forces are desirable.

Solutions of poly(arylene ether) compositions in accordance with embodiments of the present invention are typically used to coat integrated circuits formed on/in a semiconductor substrate or wafer. Typically the solution encompasses one or more of the poly(arylene ether) compositions of the present invention and is applied to the wafer using a spin-coating process. However, other appropriate coating processes, for example spraying, can also be employed.

Solvents suitable for use in such solutions of poly(arylene ethers) of the present invention include aprotic solvents, for example cyclic ketones such as cyclopentanone, cyclohexanone, cycloheptanone, and cyclooctanone; cyclic amides such as N-alkylpyrrolidinone wherein the alkyl has from about 1 to 4 carbons atoms and N-cyclohexyl-pyrrolidinone and mixtures thereof. Solutions using cyclohexanone are preferred.

The preferred cyclohexanone solution of the present invention is formed by combining cyclohexanone solvent and poly(arylene ether) composition under ambient conditions in any conventional apparatus having a non-metallic lining. Preferably, a glass-lined apparatus is employed. The resulting solution is comprised of, based upon the total weight of the solution, from about 1 to about 50%, and preferably from about 3% to about 20% of the poly(arylene ether) composition and from about 50% to about 99%, and preferably from about 80% to about 97% of solvent.

The resulting solution is then filtered under ambient conditions via any of the filtration devices well known in the art including, but not limited to commercially available filtration cartridges having the desired porosity. Preferably, these filtration cartridges consist of a non-stick, scratch resistant material such as Teflon® available from DuPont. Although one skilled in the art can readily determine without undue experimentation the ultimate pore size of the filtration device based upon the desired application, it is generally preferable to use a filtration device having a pore size less than about 1.0 µm, and preferably less than 0.1 µm.

In some embodiments of the present invention, the mixed solution is filtered through a variety of filtration means having different pore sizes. In some embodiments, this variety of filtration means encompass sequential filtration through about 4 filtration means of decreasing pore size, the final pore size being approximately 0.1 µm or less. Such filtered solutions are then used to coat substrates, for example semiconductor wafers using, for example, spin-coating techniques.

As one of ordinary skill in the art knows, semiconductor substrates are currently available in a variety of sizes ranging from as small as three or four inches in diameter to as large as twelve inches in diameter. Therefore, it will be understood that the process parameters presented hereinafter for an 8 inch wafer are for illustrative purposes only. Modifications to the volume of material, solution concentration, viscosity, rotational speeds or the various times presented can be made for other specific applications. It will be understood that all such modifications are meant to be within the scope and spirit of the present invention.

As previously mentioned, embodiments of the present invention typically employ spin coating techniques for application of the film of the poly(arylene ether). Preferably a solution of approximately 13% of the polymer (by weight) in cyclohexanone, or other appropriate solvent, prepared in the manner previously described, is dispensed onto a wafer at or near the center of the wafer. In some embodiments, the wafer will remain stationary during the dispense cycle, while in some embodiments the wafer will turn, or spin, at a relatively low speed, typically less than about 100 revolutions per minute (rpm). The wafer is then spun, or the speed of rotation increased, typically to about 500 rpm, to uniformly spread the polymer across the surface of the wafer. In some embodiments of the present invention, the spread portion of the coating cycle is followed by a short rest period where wafer rotation is halted. Typically, the rest period, or spread period where no rest period is used, is followed by a thickness spin at a high rotational speed, typically about 2000 rpm. That is to say a portion of the cycle where the wafer's rotational speed and the time at that speed is adjusted to obtain a predetermined polymer layer thickness. Typical spin coat processes, suitable for an enhanced gapfill application and a Damascene application and including solvent removal and polymer cure steps are illustrated in Table 1 for 8 inch wafers.

TABLE 1

| Time (sec.) | Speed (rpm) | Step ID |
|---|---|---|
| Standard Process | | |
| 3.0 | 0 | Dispense |
| 5.0 | 500 | Spread Spin |
| 5.0 | 0 | Hold |
| 60.0 | 2000 | Thickness Spin |
| Damascene Process | | |
| 3.0 | 0 | Dispense |
| 60.0 | 2000 | Thickness Spin |

Once the coating process as described above, or as modified for any other specific application, is completed, the coated substrate is heated to effect a cure process. Any conventional apparatus known in the art can be employed for heating the coated wafer. Preferably, the apparatus for heating the wafer is an integral part of a spin coating apparatus used for coating the wafer, although a separate apparatus for curing coatings applied in accordance with embodiments of the present invention are also suitable. One commonly employed heating apparatus employs one or more "hot plates" to heat the wafer. This type of heating not only rapidly and directly expels the solvent from the solution and causes the film to flow, but is also easily adaptable for continuous processing operations. The coated substrate is typically heated for about 30 seconds (sec) to about 5.0 minutes (min) at temperatures ranging between about 50° C. and about 250° C., and more preferably about 100° C. and about 200° C. Multiple hot plates, e.g. between about 2 and about 5, and preferably from about 2 to about 3, can be used to process the coated substrates under similar conditions.

In some embodiments, coated substrates are heated for up to about 120 sec, and preferably from about 50 to about 70 sec, on a hot plate set at a temperature of about 70° C. to about 150° C., and preferably from about 100° C. to about 150° C. A final cure cycle is preferably employed to complete the curing of the film applied. This final cure cycle can employ a conventional thermal curing apparatus, for example an oven chamber with a temperature range of about 300° C. to about 450° C., and preferably from about 375° C. to about 425° C., for about 0.5 to about 4 hours (hr), and preferably from about 1.0 to about 2.0 hr. In some embodiments a cure pressure ranging between about 1 torr to about 2 torr is employed in addition to thermal energy. In some embodiments of the present invention an electron beam heating apparatus, as described in U.S. Pat. No. 5,003,178 issued to Livesay, et al., is employed to heat the coated substrate.

The thickness of the resulting thin-film ranges from about 0.3 μm to about 40 μm and preferably from about 0.6 μm to about 2.0 μm. The films produced by the standard process of this invention generally exhibit a thickness standard deviation less than 2%, and often less than 1%, of the average film thickness. In addition, the dielectric films of the present invention exhibit excellent gap-filling capability, filling gaps or spaces between adjacent conductive paths of 0.25 μm or less. The dielectric films of the present invention also exhibit superior planarization of typical semiconductor surfaces, where planarization of 80% or more is advantageously achieved.

In some embodiments of the present invention, a layer of silicon oxide is employed in conjunction with dielectric films formed as described above. Where such silicon oxide films are used, the silicon oxide film is generally formed overlying the polymer film using a chemical vapor deposition process. Such silicon oxide films typically are about 10 nanometers (nm) to 200 nm thick and preferably about 50 to 100 nm thick.

Where an overlying silicon oxide layer is employed, the silicon oxide layer is often used as a hard mask for forming a via or contact opening through the polymer layer. Thus a photoresist layer is formed and patterned over the silicon oxide film. The silicon oxide film is etched using any of the appropriate anisotropic etch methods, for example a reactive ion etch process employing a fluorinated hydrocarbon gas (e.g. trifluoromethane) and oxygen. Advantageously, the same anisotropic etch process is generally applicable to etching poly(arylene ether) polymers formed in accordance with the present invention.

As previously mentioned, poly(arlyene ether) polymers in accordance with the present invention can be employed in microelectronic devices other than ICs, or in ICs for purposes other than interlayer dielectrics. Thus, in some embodiments, poly(arylene ether) polymers of the present invention are employed as protective or passivation layers in ICs. Such passivation layers are formed using spin coat and dry processes as described above or by what are commonly known as a blob process. That is, a blob of the dielectric material is dispensed in liquid form to overlie the IC.

Some embodiments of the present invention encompass a layer of poly(arylene ether) polymer applied in a multichip module. In multichip modules, one or more substrates having ICs or other semiconductor devices thereon are electrically coupled to one another in a single module. Films or layers of dielectric materials formed of poly(arylene ethers) of the present invention are employed as an insulative material between the several substrates. In some multichip module embodiments, poly(arylene ethers) of the present invention are employed to provide insulation between various regions within the module or to insulate and support lead-frames or other commonly employed chip carriers or interconnect devices. A variety of methods, for example screen printing, semi-cured polymer preforms and the like are employed for providing the poly(arylene ethers) of the present invention to such multichip modules, as are known.

The following characteristics encompass non-limiting measurements that illustrate the properties of the poly (arylene ether) solutions and thin films of the present invention. Table 3 demonstrates that polymer films in accordance with the present invention possesses superior thermo-mechanical and electrical properties:

1) Film Thickness (A): Film thickness is measured using a calibrated Nanospec® AFT-Y CTS-102 model 010-180 Film Thickness Measurement System available from Nanometrics, Co. An average of measurements at five locations on a wafer are reported as the film thickness for each sample.

2) Film Stress (MPa): Film stress is measured using a Flexus™ model 2410 Film Stress Measurement System available from Tencor Instruments using standard methods.

3) Residual Stress (MPa): Residual stress is measured using a Flexus™ model 2410 Film Stress Measurement System available from Tencor Instruments. A wafer coated with a cured poly(arylene ether) film is heated from ambient to a temperature of 400 to 450° C. over 60 min. Stress measurements of the film are made at one minute intervals.

The temperature is then decreased to 25° C. over 60 min with stress measurements made at one minute intervals. The temperature is then held constant at 25° C. for 6 hours and stress measurements made at six minute intervals. The cycle is repeated 4 additional times and the Residual Stress values reported are after the completion of five cycles.

4) Molecular Weight ("MW"): Molecular weight is determined using a gel phase chromatography system from Waters Corporation, Milford, Mass., equipped with a Waters 510 pump, Waters 410 differential refractometer and a Waters 717 autosampler. The procedure used is as set forth by S. Rosen in "Fundamental Principles of Polymeric Materials, pages 53–81, (2nd Ed. 1993) and incorporated herein by reference.

5) Dielectric Constant: Dielectric constant is determined using the capacitance-voltage ("CV") measurement technique and employs a Hewlett-Packard Model 4061A semiconductor measurement system at a frequency of 1 MHz. The test procedure set forth by Lau et al. in "Characterization and Thin-Film Properties of FLARE™, A Low Dielectric Constant, High Tg Fluorinated Poly(arylene ether), as an Intermetal Dielectric for Interconnect Applications," Proceedings of Low Dielectric Constant Materials and Interconnects Workshop (California Apr. 30–May 1, 1996) is used and is incorporated herein by reference. This test procedure employs a metal-insulator-metal (MIM) structure with the thickness of each layer ranging from about 0.5 to 1 micron ($\mu$m).

6) Differential Scanning Calorimetry {"DSC"): The Glass Phase Transition Temperature, Tg, is determined using a Perkin-Elmer Model DSC 7 by cooling a sample at a rate of 10° C./min from 450° C. to 25° C. after a dwell time of 5 minutes at 450° C.

7) Dynamic Mechanical Analysis ("DMA"): The storage modulus and loss modulus (both having units of MPa) are measured using a Dynamic Mechanical Spectrometer 110 available from Seiko Instruments Inc., USA. The Flexural Mode (3 point bending mode) with a frequency of 1 Hz is used between 25° C. to 450° C. at a heating rate of 3° C./min.

8) Thermal Mechanical Analysis ("TMA"): The coefficient of thermal expansion ("CTE") is measured using a Perkin-Elmer Series 7 Thermal Mechanical Analyzer. Film disks having a 10 mm diameter and either a 5 to 10 $\mu$m or a 20 to 40 $\mu$m film thickness are heated at a rate of 10° C./min from 25° C. to 450° C. with a continuous force of about 2 to 3 milli-Newtons (mN) applied to the film in extension. CTE is derived from the slope of the graph of the film dimension increase (ppm) versus temperature (°C.).

9) Gap-fill Ability ($\mu$m): A patterned wafer with a cured, 1 $\mu$m thick layer of a poly(arylene ether) formed thereon is cleaved to allow a cross-sectional view of the coated patterned wafer using a Scanning Electron Microscope (SEM). The reported values represent the smallest gap sizes of the wafer's pattern that are completely filled by the polymer without defects.

10) Solution Viscosity (cP): A Brookfield Synchro-lectric Viscometer, Model LVT 62238 is employed to measure the viscosity of a 13–14% solution of a poly (arylene ether) in cyclohexanone at ambient temperature.

11) Refractive Index-Out of Plane and In Plane, ("$n_{TE}$") and ("$n_{TM}$"), respectively: Details of this test procedure are set forth in A. J. McKerrow et. al., "Characterization of Low k Dielectrics for ILD Applications," Proc. of Low Dielectric Constant Materials and Interconnects Workshop, (California, Apr. 30 to May 1, 1996). The prism coupling method of McKerrow et. al., is also exemplified in related publications directed to polyimide films, which include J. D. Swalen, et al., "Determination of Optical Constants of Polymeric Thin Films by Integrated Optical Techniques," Optical Communications, vol. 18, page 387 (1976).

12) Thermal Stability: Both the isothermal thermal gravimetric analysis (1TGA') (microgram loss/time) and thickness change (%) were determined using the procedure set forth in Lau, K. S. Y., et al, "Characterization and Thin-Film Properties of FLARE™, A Low Dielectric Constant, High Tg Fluorinated Poly(arylene ether), as an Intermetal Dielectric for Interconnect Applications," Proceedings, Thirteenth International VLSI Multilevel Interconnection (VMIC) Conference & Poster Session (California, Jun. 18–20, 1996), incorporated herein by reference.

13) Adhesion to Surfaces:

a) Sample Prep: A six or eight inch diameter wafer is preferred as wafers less than six inches are relatively thin and likely to shatter before the measurement is complete. The wafer is coated using an appropriate spin, bake, and cure cycles. In some embodiments, an optional capping layer is formed overlying the polymer film prior to stud-pulling to prevent the epoxy used to fix the stud to the sample from diffusing through the film to strengthen the interface between the film and the substrate. Where such a layer is employed, a layer of aluminum at least 2000 Å thick can be used. In some embodiments a silicon nitride capping layer is employed.

b) Stud Application: Studs, kept refrigerated until just before use are glued to the center of at least 15 to 20 samples per wafer made by cleaving the wafer into 1 cm$^2$ samples. The studs samples with a small vice/clip device (the tool and method are self-explanatory), and the samples are then baked at 150° C. for 60 minutes to cure the epoxy and then cooled to ambient temperature.

c). Measurement A Sebastian-5A stud-pull instrument manufactured by The Quad Group, Spokane, Wash., is used to measure the adhesion strength of the polymer film. The tail of the stud is inserted into a receiving cavity in the instrument and automatically pulled upon a until the system senses a break. The value recorded is expressed in ksi (thousand pounds per square inch)

EXAMPLES

Embodiments of the present invention will be further described and understood by reference to the following working examples thereof. These examples are provided to illustrate the present invention and do not provide limits or restrictions thereto.

A. MONOMERS

Two organic synthesis procedures for the starting monomer bis(4-fluorophenyl)ethyne are included in the method of this invention. These routes are 1) organopalladium coupling, and 2) organotin coupling.

Example A1 describes the synthesis of bis(4-fluorophenyl)ethyne using a palladium[II] complex plus copper[I] iodide catalyst system, and a trialkyl substituted silylacetylene starting material. Included in this example is a method for producing an alternative palladium[0] catalyst, tetrakis(triphenylphosphine)palladium[0], which may be appropriately used in the synthetic route described.

Example A2 describes an alternate synthetic route for bis(4-fluorophenyl)ethyne using an organotin intermediate. Notably, the palladium catalyst used to couple the organotin with a dihalobenzene is a tetrakis(triarylphosphine) palladium[0]; i.e., tetrakis(triphenylphosphine) palladium [0].

Example A3 describes a commercial scale synthetic route for the production of the bis(4-fluorophenyl)ethyne monomer using the ethynyltrialkylsilane starting material and the palladium[II]/copper[I] catalyst system.

Examples A4–A6 are directed to the synthesis of compounds corresponding to the $Ar_1$ monomers of the poly (arylene ethers) of this invention.

Examples A7 and A8 describe the synthesis of compounds corresponding to the $Ar_2$ monomers of the poly(arylene ethers) of this invention.

Examples A9–A11 are directed to the synthesis of compounds corresponding to the $Y_r$ monomers of the poly (arylene ethers) of this invention.

Example A1

Preparation of Bis(4-Fluorophenyl)Ethyne (BFPE) via Palladium Coupling

Preparation of the bis(4-fluorophenyl)ethyne (also called 4,4'-difluorodiphenylacetylene) monomer via palladium coupling proceeds by the following three step process.

In a 1 Liter, round-bottom, three neck flask, a solution of 50 milliLiters (mL) (0.51 Mol) ethynyltrimethylsilane, 1.5 grams (g) of palladium(II)acetate, 2.0 g of copper[I] iodide, 3.0 g of triphenylphosphine and 58 mL (0.52 Mol) of 4-bromofluorobenzene in 500 mL of de-aerated triethylamine was heated to 80° C. with stirring under an argon blanket for 2 h. A white precipitate started to form after approximately 30 minutes (min). The reaction mixture was then cooled to 50° C. and stirred for an additional 2 h and then allowed to cool to room temperature with stirring overnight. The orange solution was filtered and a white precipitate of triethylamine hydrobromide was removed. The filtrate was concentrated by removal of the solvent. The residue was dissolved in 200 mL of dichloromethane and the resulting solution washed with water (3×150 mL), 5% HCl (3×100 mL), saturated sodium bicarbonate solution (3×150 mL), brine and then dried over sodium sulfate. After removal of the solvent, a clear oil was obtained 42.3 g (93%). It has been observed that an appropriate amount of a palladium[0] catalyst can be used instead of the palladium [II]/copper[I] iodide catalyst system described above. Preparation of the palladium[0] catalyst is described below.

1-Ethynyl-4-fluorobenzene was obtained by dissolving the oil obtained above in 200 mL of methanol, to which 2 g of potassium carbonate was added with the stirring continued overnight at ambient temperature. Upon distillation, 22.8 g, (0.19 Mol, 82%) of 1-ethynyl-4-fluorobenzene was obtained as a clear colorless liquid.

Bis(4-fluorophenyl)ethyne was obtained by coupling 4 bromofluorobenzene with the previously obtained 1-ethynyl-4-fluorobenzene. To the 22.8 g (0.19 Mol) of 1-ethynyl-4-fluorobenzene and the 33.3 g (0.19 Mol) of 4-bromofluorobenzene in 500 mL of de-aerated triethylamine, 1.5 grams (g) of palladium[II] acetate, 2.0 g of copper[I] iodide, 3.0 g of triphenylphosphine were added and heated with stirring under an argon blanket to 80° C. for 2 h. The reaction mixture was cooled to 50° C. and stirred for an additional 2 h and then cooled to room temperature with stirring overnight. The overall yield of the product obtained was 15.6 g (55.6%). The yield of this reaction could be improved to 84% if 4-fluoroiodobenzene and the palladium[0] catalyst were used. Column purification (95:5 hexanes:dichloromethane) of the product was necessary to obtained polymer-grade quality (purified yield: 14.8 g, 53%). White needles were obtained when recrystallized from hot methanol. As in the first coupling reaction, a palladium[0] catalyst could be used instead of the palladium [II]/copper[I] iodide/triphenyl phosphine catalyst system. We have discovered that the second step in the palladium coupling sequence resulted in higher yields (two-fold) if fluoro-4-iodo-benzene (80%) was used instead of 1-bromo-4-fluorobenzene (37%).

The efficacy of the palladium catalyst is critical to the coupling of bromo-4-fluorobenzene and ethynyltrimethylsilane. The palladium catalyst system used in the palladium coupling route for the above described synthesis of the bis(4-fluorophenyl)ethyne monomer was a palladium[II] catalyst; i.e., bis(triphenylphosphine)palladium[II] acetate or bis(triphenylphosphine)palladium[II] chloride, in combination with a reductant, copper[I] iodide. Alternately, a tetrakis(triarylphosphine)palladium[0] catalyst such as tetrakis(triphenylphosphine)palladium[0] can appropriately be used in place of bis(triphenylphosphine)palladium[II] complex and copper[I] iodide, substituting 5.87 g of tetrakis (triphenylphosphine)palladium[0] for the 1.5 g of palladium acetate and eliminating the copper[I] iodide.

Synthesis of the tetrakis(triphenylphosphine)palladium[0] catalyst employs the following process. A mixture of palladium dichloride (17.72 g, 0.10 Mol), triphenylphosphine (131 g, 0.50 Mol) and 1,200 mL dimethylsulfoxide (DMSO) was placed in a 3-neck round-bottom flask equipped with a magnetic stir bar and argon inlet. The mixture was heated under argon to 140° C. at which time the solution became a reddish and clear solution. Various color changes were observed during the course of the reaction from yellow to green to orange to red. Hydrazine hydrate (55% solution) was quickly added via a syringe at 140° C. Vigorous evolution of nitrogen was observed. The reaction was then cooled slowly to room temperature and a yellow (fluorescent yellow) solid precipitate, tetrakis(triphenylphosphine) palpalladium[0], was produced. As this compound is very sensitive to air, the precipitate was filtered under argon to yield 108 g, (94%) While the use of palladium dichloride is convenient, an appropriate amount of palladium diacetate can alternatively be employed. In addition, triphenylphosphine can be replaced by other triaryl phosphines, for example appropriate amounts of tri (o-tolyl)-, tris(biphenyl)- and tris(dimethylphenyl)phosphines may be used as ligands.

Example A2

Preparation of Bis(4-Fluorophenyl) Ethyne (BFPE) via Organotin Coupling

Preparation of the bis (4-fluorophenyl)ethyne monomer via organotin coupling proceeds by the following two step process.

A mixture of 48.8 g (0.150 Mol) of tri-n-butyl-tin chloride and 20.7 g (0.225 Mol) of lithium acetylide ethylenediamine complex in 300 mL of anhydrous THF was heated at reflux under argon for 24 h, cooled and treated with 200 mL of water. The layers were separated and the THF phase was suction-filtered through Celite with a 150 mL THF wash to afford a clear solution. This solution was washed with water (3×200 mL), saturated aqueous sodium bicarbonate (2×100 mL), 5% HCl (2×100 mL), and dried over anhydrous sodium sulfate. Removal of the solvent gave 40.2 g (88%) of the bis(tri-n-butylstannyl)ethyne as a colorless liquid. A mixture of 42.0 g (120 mMol) of 4-bromofluorobenzene, 30.2 g (50 mMol) of bis(tri-n-butylstannyl)acetylene and 2.5 g (2.24 mMol) of tetrakis(triphenylphosphine)palladium[0] under an argon atmosphere was dissolved in 200 mL of dry THF. The reaction mixture was refluxed under an argon atmosphere for 60 h. The solution was cooled to room temperature and subsequent cooling in a refrigerator overnight yielded 11.2 g (67%). The reaction was run at double the scale mentioned above and gave similar yields without any complication in the work-up procedure.

The organotin coupling reaction between bis (tributylstannyl)ethyne and 2 moles of 1-bromo-4-fluorobenzene is an alternative method for making symmetrically diarylated acetylenes. The overall yield for the reaction is generally 65%. We have additionally discovered that this synthesis route requires the use of the palladium[0] complex catalyst and will not proceed with the palladium[II] complex+copper[I] iodide.

Example A3

Bis(4-Fluorophenyl)Ethyne (BFPE)
Step 1—Trimethylsilylethynylation of 1-halo-4-fluorobenzene 1-Bromo-4-fluorobenzene (791.2 g, 4.5 Me), ethynyltrimethylsilane (500 g, 5.09 Me), 10 g of dichlorobis (triphenylphosphine)palladium[II] catalyst, 700 mL of anhydrous triethylamine, 8 g of copper[I] iodide, and 12 g of triphenylphosphine were placed into the $N_2$ purged, 5-Liter 4-neck round-bottom flask, equipped with an overhead mechanical stirrer, condenser, and positioned inside a heating mantle.

The mixture was heated to a gentle reflux (about 88° C.) and maintained at reflux for 7 hours. The reaction mixture became a thick black paste and was cooled. Gas chromatographic analysis indicated complete conversion of starting material 1-bromo-4-fluorobenzene. The solids were filtered and washed with ether. The ether solution was extracted twice with 300 mL of water and dried over anhydrous sodium sulfate. After filtering off the sodium sulfate, the filtrate was evaporated on a rotary evaporator to give 1,650 g of a crude solid. The material was distilled in the Kugelrohr with the receiver flask in a Dry Ice/acetone bath. 1,432 g were recovered. 82% yield.

Step 2—Conversion of 1-fluoro-4-(trimethylsilyl) ethynyl-benzene to 1-ethynyl-4-fluorobenzene A 12-Liter 3-neck round-bottom flask equipped with a nitrogen inlet, an overhead mechanical stirrer, was charged with 6 Liters of methanol, 1,432 g of 1-fluoro-4-(trimethylsilyl)ethynylbenzene, and 98 g of anhydrous potassium carbonate. Stirring was continued until no starting material was detected by gas chromatographic analysis (about 1 hour).

The reaction mixture was then filtered into a one-neck flask and cold-distilled under reduced pressure at the aspirator. The product remained in the flask while methanol was collected in a receiver chilled in a Dry Ice/acetone bath (−78° C.). A Dry Ice/acetone trap was also placed in the vacuum line. The content in the receiver was redistilled and this process was repeated several times until the content of the receiver showed negligible amount of product. A total of 720 g of the desired product was collected. Notably, the 1-ethynyl-4-fluorobenzene is used as a starting material in the synthesis of 1,4-bis(4-fluorophenylethynyl)benzene of Example A4.

Step 3—Conversion of 1-Ethynyl-4-fluorobenzene to Bis(4-fluorophenyl)ethyne-(4,4'-difluorodiphenylacetylene)

A 2-Liter 4-neck round-bottom flask, equipped with an overhead mechanical stirrer, a nitrogen inlet, a condenser, placed inside a heating mantle, was charged with 1-ethynyl-4-fluorobenzene (500 g, 4.165 Mol), 1-fluoro-4-iodobenzene (715 g, 3.23 Mol), 22.5 g of dichlorobis (triphenylphosphine)palladium[II] catalyst, 6 g of copper[I] iodide, 8 g of triphenylphosphine, and 800 mL of anhydrous triethylamine. This was heated to reflux (~88° C. ) with stirring. Heating continued for 1 hour after which a gas chromatograph sample showed <1% starting material remained. The reaction mixture was cooled and the copious precipitate was filtered. The solids were washed with dry triethylamine. The combined triethylamine solutions were concentrated on the rotary evaporator and the brown residue was taken up in a minimum of dichloromethane. This was placed on a silica gel plug (about 1.5 kg) and eluted with hexanes (8L). The hexane fractions were concentrated on the rotary evaporator. The solid was recrystallized from methanol. The recrystallized solid, now a pale yellow material, was taken up in portions with hexane and the solution run through another silica gel plug (about 2 kg). The first 8L were clear, the next 16L (using recycled hexane) were yellow. The clear solutions were combined and stripped of solvent to yield a white solid. The yellow solutions were run through another clean silica gel plug to give a clear solution. This was stripped of solvent to give a white solid. The white solids were combined and dried to constant weight in a vacuum oven giving 648 g of the final product. (73% yield, m.p. 95°–97° C.).

Example A4

Preparation of 1,4-Bis(4-Fluorophenylethynyl) Benzene (BFPEB)

1,4-Bis(4-fluorophenylethynyl)benzene (BFPEB) is prepared via palladium coupling of 1,4-diiodobenzene (or 1,4-dibromobenzene) and 1-ethynyl-4-fluorobenzene according to the following process.

To 300 mL of deaerated triethylamine contained in a 500 mL, 3-neck, round-bottom flask equipped with a magnetic stirrer, a thermocouple, and a condenser were added 1,4-diiodobenzene (33.0 g, 0.10 Mol), 1-ethynyl-4-fluorobenzene (24.0 g, 0.20 Mol) [see examples A1 and A3], and tetrakis(triphenylphosphine)palladium[0] (3.0 g). The reaction mixture was heated to 80° C. with stirring under argon for 3 hr and then cooled to room temperature and stirred overnight (16 hr). The reaction mixture was filtered to remove a white precipitate of triethylamine hydroiodide. The triethylamine solvent was evaporated and the solid was dissolved in dichloromethane. The resulting solution was washed with water (2×100 mL), 2% HCl (2×100 mL), brine and then dried over sodium sulfate. After removal of the solvent, the isolated crude product was purified by silica gel column chromatography (hexanes, elutant), yielding (80%) pure BFPEB as white crystals with a melting point of 207–209° C. Use of 1,4-dibromobenzene instead of 1,4-diiodobenzene as the starting material resulted in the same product with much lower yield (51%).

Example A5

Preparation of 4,4'-Bis(4-Fluorobenzoyl) Tolane (4, 4'-FBZT)

The monomer 4,4'-bis(4-fluorobenzoyl)tolane or 4,4'-bis (4-fluorobenzoyl)diphenylacetylene is prepared from the Friedel-Crafts acylation of diphenylacetylene with 4-fluorobenzoyl chloride according to the following process.

To a 100 mL, 3-neck, round-bottom flask equipped with a magnetic stirrer, a thermocouple, and a condenser were placed 2.67 g (15.0 mMol) of diphenylacetylene, 5.00 g (31.5 mMol) of 4-fluorobenzoyl chloride, and 50 mL of dichloromethane. Anhydrous aluminum chloride (7.34 g, 55.0 mMol) was added slowly with stirring. The reaction mixture was heated at reflux overnight (16 hr) with stirring, then quenched by pouring it into a mixture of ice and dilute HCl. The solution was extracted with 3 portions of dichloromethane (25 mL each). The resulting solution was washed with water (2×30 mL), saturated sodium bicarbonate solution (2×30 mL), brine, and then dried over sodium sulfate. After removal of the solvent, the product was purified by silica gel column chromatography (1:1 dichloromethane-hexanes, elutant) in the yield of 42%.

Alternately, an organotin catalyst can be used to prepare 4,4'-bis(4-fluorobenzoyl)tolane according to the method described in Example A2 and the additional following process steps as discussed in the previously mentioned Sutherlin et al. reference.

Into a 100 mL, 3-neck, round-bottom flask equipped with a magnetic stirrer, a thermocouple, and a condenser were placed 5.08 g (18.2 mMol) of 4-bromo-4'-fluorobenzophenone (Rieke Metals, Inc.), 0.50 g (0.43 mMol) of tetrakis(triphenylphosphine)palladium, and 25 mL of tetrahydrofuran (THF). After complete dissolution of all solids, a THF solution (15 mL) of bis(tri-n-butylstannyl) acetylene (5.00 g, 8.28 mMol) was added drop by drop to the first solution. The reaction mixture was then heated at reflux for 24 hr under argon. A white crystal formed gradually during this period. The off-white crystal (2.30 g, 66% yield) was separated by filtration and washed with 3 portions of cold THF (30 mL each).

Example A6

Preparation of 4-Fluoro-3'-(4-Fluorophenylethynyl) Benzophenone (3-FPEK)

The monomer of 4-fluoro-3'-(4-fluorophenylethynyl) benzophenone (3-FPEK) was prepared according to the following coupling process.

Into a 500 mL, 3-neck, round-bottom flask equipped with a magnetic stirrer, a thermocouple, and a condenser were placed 24.00 g (200.0 mMol) of 1-ethynyl-4-fluorobenzene (see examples A1 and A3), 55.82 g (0.20 Mol) of 3-bromo-4'-fluorobenzophenone (Rieke Metals, Inc.), 3.0 g of tetrakis (triphenylphosphine)palladium(0), and 300 mL of de-aerated triethylamine. The reaction mixture was heated to 80° C. with stirring under argon for 3 h and then cooled to room temperature and stirred overnight (16 hr). The reaction mixture was filtered to remove a white precipitate of tri-ethylamine hydrobromide. The triethylamine solvent was evaporated and the solid was dissolved in dichloromethane. The resulting solution was washed with water (2×100 mL), 2% HCl (2×100 mL), brine, and then dried over sodium sulfate. After removal of the solvent, the product (3-PFEK, m.p. 127–128° C.) was purified by silica gel column chromatography (hexanes, elutant) in the yield of 85%.

Example A7

Preparation of 2,3-Bis(4-Fluorophenyl)Quinoxaline

The starting material 2,3-bis(4-fluorophenyl)quinoxaline can be easily prepared by the following process.

The condensation of 4,4'-difluorobenzil and 1,2-phenylenediamine is completed overnight at 50° C. in chloroform and in the presence of a catalytic amount of trifluoroacetic acid.

4,4'-difluorobenzil (35.0 g, 0.142 Mol) and 1,2-phenylenediamine (15.4 g, 0.142 Mol) were dissolved in 300 mL of chloroform in a 500-mL, 3-neck, round-bottom flask equipped with a magnetic stirrer, a thermocouple, and a condenser. Trifluoroacetic acid (1.5 mL) was added into the flask slowly and the reaction mixture was heated to 50° C. The reaction solution was stirred at this temperature overnight (16 hr) and then allowed to cool to room temperature.

The reaction mixture was washed three times with dilute hydrochloric acid after an overnight reaction. The solvent was removed by a rotary evaporator. A pure compound (m.p 127–129° C.) was recrystallized from ethanol with a final yield of 88–92%.

Example A8

Synthesis of an Isomeric Mixture of 6,6' and 6,7'-difluoro-1,4-bis(3-phenylquinoxalin-2-yl)benzenes A 1-Liter, 3-neck round-bottom flask equipped with a nitrogen inlet, stirring and a condenser, was charged with a 300-mL toluene solution of 4-fluoro-1,2-diaminobenzene (3.6167 g, 28.70 mMol). The toluene solution was heated to approximately 45° C. and under a nitrogen blanket, with stirring, 200-mL of a toluene solution of 1,4-bis (phenylglyoxaloyl)benzene (4.0298 g, 11.77 mMol), obtained from Cemota S. A., was added dropwise over 4 hours. The reaction mixture was stirred at for an additional 30 h at 45° C., at which time thin layer chromatography (30% ethyl acetate in hexanes) of a sample removed from the reaction vessel indicated that the reaction was complete. The toluene solvent was evaporated by a rotary evaporator and the solids obtained washed with 120 mL of ethyl acetate and then with 30 mL of acetone, before drying in an oven. The final yield was 3.31 g (50.2%), m.p. 238–240° C.

Example A9

Synthesis of 4,4'-Dihydroxy-1,1'-Binaphthyl

It is well known that thermotropic para-linked aromatic polyesters containing 1,1'-binaphthyl-4,4'-ylene monomer units show dramatic enhancement of Tg in comparison with polyesters without the binaphthyl units (see M. Hohlweg, and H. W. Schmidt, Makromol. Chem., 190, 1587 (1989)). Incorporation of this unit in polyimides also resulted in very high Tg (338–404° C.) materials (see R. Giesa, U. Keller, and H. W. Schmidt, Amer. Chem. Soc. Polymer Preprints, 33(1), 396 (1992)). We have synthesized 4,4'-Dihydroxy-1, 1'-binaphthyl with a 29% yield using a procedure according to Z. Dianin, Ber. deutsch. Chem. Ges., 6, p. 1252, (1873).

In one embodiment of the poly(arylene ethers) of this invention, we have substituted the fluorene bisphenol monomer with 4,4'-dihydroxy-1,1'-binaphthyl. The synthesis of 4,4'-dihydroxy-1,1'-binaphthyl according to Dianin was not followed, however, in favor of a higher-yield modern Thallium-mediated procedure (see A. McKillop, A. G. Turrell, and E. C. Taylor, J. Org. Chem., 42, 764 (1977); and A. McKillop, A. G. Turrell, D. Y. Young, and E. C. Taylor, J. Amer. Chem. Soc., 102, 6504 (1980)).

Conversion of 1-methoxynaphthalene to 4,4'-dimethoxy-1,1'-binaphthyl under the thallation condition is straightforward according to the McKillop references. The direct conversion of 1-hydroxynaphthalene to 4,4'-dihydroxy-1,1'-binaphthyl under the same condition is not mentioned in this study but is not expected to be a good reaction because of the strong possibility of over-oxidation of 1-hydroxynaphthalene to quinones or quinoid type polymers by thallium[III].

We have demonstrated that the Thallium[III] trifluoroacetate (TTFA)-mediated biaryl coupling is a high-yield reaction for the formation of 4,4'-dihydroxy-1,1'-binaphthyl.

Step 1—4,4'-Dimethoxy-1,1'-binaphthyl via Thallium Coupling of 1-Methoxynaphthalene To a solution of tris(trifluoroacetato)thallium[III] (21.734 g, 0.040 Mol) in 100 mL of acetonitrile was added neat (without solvent) 1-methoxynaphthalene (12.656 g, 0.080 Mol). Boron trifluoride etherate (about 40 g, or 40 mL) was added dropwise to the mixture. Thin-layer chromatography (TLC) of the reaction mixture after 1 hr at 25° C., using 55% hexane in chloroform as elutant, showed that the reaction was nearly complete. The mixture was worked up after a total reaction time of 1.5 hr by pouring the mixture into 0.5 L of water and extracting the mixture with 2×400 mL of chloroform. The combined chloroform extracts were dried with magnesium sulfate and filtered. The crude solid was found quite pure by a single spot on the thin-layer chromatogram and characterized by NMR spectroscopy.

Step 2—4,4'-Dihydroxy-1,1'-binaphthyl via BBr3-Demethylation of 4,4'-Dimethoxy-1,1'-binaphthyl To a solution of 4,4'-Dimethoxy-1,1'-binaphthyl (16.055 g, Mol) in 50 mL of dichloromethane, inside a 250-mL round-bottom flask cooled to −78° C. in a Dry Ice/acetone bath, was added boron tribromide (153 g) in 50 mL of dichloromethane through a syringe. The reaction mixture was allowed to warm to room temperature over 2 hours and a clear, light brown solution was obtained. After 18 hr stirring at room temperature, the brown solution was slowly poured into 500 mL of water to yield a white precipitate. After stirring for 1 hr under a stream of nitrogen, the white solid was filtered and washed thoroughly with water. Thin-layer chromatography ($SiO_2$, eluting with showed that it was pure. The product was very soluble in ethanol, slightly soluble in toluene, and fairly soluble in ethyl acetate. Polymerization-grade material was obtained by column chromatography (38% ethyl acetate in hexane as elutant). The white solid was characterized by NMR spectroscopy.

Example A10

Synthesis of 4,4'-Dihydroxysexiphenylene

The synthesis of the 4,4'-dihydroxysexiphenylene moiety proceeds by a four step process as follows.

Step 1

To a 4 L beaker, was added 100 g of the sodium carbonate in 1L of $H_2O$, stirred until dissolved, and then added 156.75 g of 4-methoxyphenylacetic acid. To a 500 mL beaker, was added 189.5 g of $MnCl_2.4H_2O$ in 125 mL of $H_2O$, then the solution of $MnCl_2$ was added to the first mixture with stirring to give about 2.500 mL of a foam with pink color. After adding 3 drops of octanol, the volume of the foamy mixture was decreased to about 1.500 mL, which was washed with water, then filtered and dried in vacuum to give 211 g of light pink powder. 100 g of them were distilled at 300–320° C. under vacuum during 30 min to afford 43 g of white crystals of 1,3-bis (4-methoxyphenyl)propanone in 72% yield. The TLC test (eluting with dichloromethane) indicated product is pure and has a m.p. of 75–76° C.

Step 2

To a 350 mL round-bottom flask equipped with condenser and stirrer, were placed 30 g of 1,3-bis (4-methoxyphenyl) propanone and 23.33 g of benzil in 200 mL of absolute alcohol. The mixture was heated to incipient boiling, then a solution of 3 g of KOH in 20 mL of $H_2O$ was added, then the mixture was heated to reflux for 30 min to form a purple-black slurry. The slurry was cooled, filtered, washed with cold ethanol and dried in vacuum to afford 45 g (91%) of 4,4'-dimethoxytetracyclone. The TLC test (eluting with dichloromethane) indicated the product is pure. M.P. 186–188° C.

Step 3

To a 300 mL round bottom flask equipped condenser, $N_2$ inlet, thermometer and stirrer, was added 44.453 g of 4,4'-dimethoxytetracyclone and 19.605 g of diphenylacetylene in 150 mL of sulfolane. The mixture was heated at 260–270° C. for 2 hr, the intense purple color turned into light brown. The crude product was cooled and poured into 1 L of $H_2O$ with stirring, then filtered, washed with $H_2O$ and dried in vacuum to give 58 g (97%) of 4,4'-dimethoxysexiphenylene. The TLC test (eluting with dichloromethane) indicated the product is pure. M.P. 328–330° C.

Step 4

To a 500 mL flask equipped $N_2$ inlet, thermometer and stirrer, was added 25 g of 4,4'-dimethoxysexiphenylene in 150 mL of $CH_2Cl_2$. The flask was cooled in dry ice/acetone. When temperature reached to −78° C., 169 mL of $BBr_3$ (1M in $CH_2Cl_2$) was added, then allowed to warm to RT and stirred for 12 hr. About 300 mL of the resulting mixture were poured to 1.500 mL of $H_2O$ under $N_2$ and with stirring. The rotary evaporator was used to distill $CH_2Cl_2$ solvent, then filtered and dried in vacuum to yield a 30 g of crude products. The crude products was purified by silica gel column chromatography and eluting with $CH_2Cl_2$ to afford 20 g of white crystals (87%). The TLC test (eluting with dichloromethane) indicated the product is pure. Mp: 447–449° C. The end product after 4 steps was 4,4'-dihydroxysexiphenylene.

Example A11

Synthesis of 2,7-Dihydroxyspiro(9',9'-Fluorene-10, 10-Xanthene)

The synthesis of 2,7-dihydroxyspiro(9',9'-fluorene-10,10-xanthene) proceeds according to the following process.

Fluorenone (22.5 g, 0.125 Mol) and resorcinol (45.0 g, 0.413 Mol), loaded in a 100 mL European style flask, equipped with a gas inlet-outlet port and thermometer, were heated in the molten state at 180–200° C. for 4.5 hours, while HCl was let in via the extended inlet tube and through the melt. Excess HCl gas was vented through via the outlet port into a HCl-absorbing aqueous pool. The brown viscous mass was poured out, cooled, crashed, extracted with water (3×500 mL), and dried. The resulting solid was extracted 2 times with 380-mL portions of boiling benzene. The hot filtrates were combined and cooled; and the precipitated solid was filtered and dried, yielding 20.0 g (44%) of a crude product. It was subjected to flash chromatographic purification, and then crystallization from acetonitrile, giving 7.3 g (yield 16%) of pure 2,7-dihydroxyspiro(9',9'-fluorene-10,10-xanthene), small white crystals, m.p. 270–271° C. Elemental analysis: Calculated: %C, 82.40, %H, 4.42. Found: %C, 82.39, 82.32; %H, 4.42, 4.53.

B. POLYMERS

Examples B1–B11 are directed to the poly(arylene ether) copolymers of various ratios of bis(4-fluorophenyl)ethyne ($Ar_1$) and 4,4'-difluorobenzophenone ($Ar_2$), each combined with a bis(fluorene) diol ($Y_r$). Example B1 includes a synthesis for a copolymer having equal molar ratios of $Ar_1$ and $Ar_2$. As the same process steps are used for each of the other copolymers of B5–B10, and for the homopolymers of Examples B2–B4 and B11, the steps are not repeated and the results of Examples B2–B11 are, instead, presented in Table 2 below.

Example B12 is directed to the poly(arylene ether) copolymers of examples B1 and B5–B10 wherein bis(4-fluorophenyl)ethyne ($Ar_1$) is pre-reacted. While a single example of such pre-reaction is given, it is understood that this method is of general applicability.

Example B13 is directed to the poly(arylene ether) copolymer encompassing bis(4-fluorophenyl)ethyne ($Ar_1$), 2,3-bis(4-fluorophenyl)quoxaline ($Ar_2$) and fluorene bisphenol ($Y_r$). While only a single ratio of n to m is illustrated, other ratios are readily produced in a manner analogous to that for the various ratios of examples B1–B11.

Example B1

Bis(4-Fluorophenyl)Ethyne, 4,4'-Difluorobenzophenone Copolmer where n:m=1:1

A 5-Liter, 3-neck round-bottom flask, equipped with an overhead mechanical stirrer, a thermocouple, a reflux condenser and Dean-Stark trap assembly, and a nitrogen inlet-outlet connection, was purged with nitrogen for several hours and charged with 1 Liter of warm sulfolane. At 80–100° C., fluorene bisphenol ($Y_r$) (210.2520 g, 0.6000 Mol), bis(4-fluorophenyl)ethyne ($Ar_1$) (64.2660 g, 0.3000 Mol), of 4,4'-difluorobenzophenone ($Ar_2$) (64.4600 g, 0.3000 Mol), and 165.84 g (1.20 Mol) of anhydrous, pulverized potassium carbonate were added and rinsed with 560 mL of warm sulfolane and 500 mL of toluene. The reaction mixture was heated until boiling at approximately 135° C., the azeotropic distillation was continued for 2 hours while the temperature of the mixture gradually rose from 135° C. to 180° C. as recovered toluene was gradually removed from Dean-Stark trap. The reaction was continued at 180° C. with constant azeotropic distillation during 18–22 hr. The reaction mixture was diluted with 780 mL of N-methylpyrrolidinone (NMP), filtered hot (approximately 140° C.) and precipitated in 13 Liters of methanol. The precipitate was filtered, washed 3 times with 3.2 Liter portions of methanol, and dried in a vacuum oven for approximately 72 h at 90–100° C. until constant weight, giving 307.3 g (yield 97.2%) of the almost uncolored polymer. After final purification, a 13% solution of the polymer in cyclohexanone contained less than 50 ppb of any metal.

Example B12

Bis(4-Fluorophenyl)Ethyne, 4,4'-Difluorobenzophenone Copolmer where n:m=1:3 and Bis(4-Fluorophenyl)Ethyne Partially Pre-reacted A 250 mL, 3-neck round-bottom flask, equipped with a magnetic stirrer, a thermocouple, a reflux condenser and Dean-Stark trap assembly, and a nitrogen inlet-outlet connection, was purged with nitrogen for approximately 30 minutes and charged with 50 mL of warm sulfolane. At 80–100° C., fluorene bisphenol ($Y_r$) (14.0168 g, 0.0400 Mol), bis(4-fluorophenyl)ethyne ($Ar_1$) (2.1422 g, 0.0100 Mol), and 11.06 g (0.08 Mol) of anhydrous, pulverized potassium carbonate were added and rinsed with 30 mL of warm sulfolane and 20 mL of toluene. The reaction mixture was heated until boiling at approximately 135° C., the azeotropic distillation was continued for 2 hours while the temperature of the mixture gradually rose from 135° C. to 180° C. as recovered toluene was gradually removed from Dean-Stark trap. The reaction was continued at 180° C. for an additional 2 h. At this time, 4,4'-difluorobenzophenone ($Ar_2$) (6.5460 g, 0.0300 Mol) was added and rinsed with 20 mL of sulfolane and 10 mL of toluene. The reaction was continued at 180° C. for another 20 h with constant azeotropic distillation. The reaction mixture was diluted with 400 mL of N-methylpyrrolidinone (NMP), filtered hot (approximately 140° C.) and precipitated in 1 Liter of methanol. The precipitate was filtered, washed 3 times with 200 mL portions of methanol, and dried in a vacuum oven for approximately 24 h at 90–100° C. until constant weight, giving 25.5 g (yield 97.1%) of the almost uncolored polymer. After final purification, a 14% solution of the polymer in cyclohexanone contained less than 50 ppb of any metal.

Example B13

Bis(4-Fluorophenyl)Ethyne, 2,3-Bis(4-Fluorophenyl)Quoxaline Copolymer where n:m=1:1

A 1 Liter, 3-neck round-bottom flask, equipped with an overhead mechanical stirrer, a thermocouple, a reflux condenser and Dean-Stark trap assembly, and a nitrogen inlet-outlet connection, was purged with nitrogen for approximately 30 minutes and charged with 150 mL of warm sulfolane. At 80–100° C., fluorene bisphenol ($Y_r$) (58.8706 g, 0.1680 Mol), bis(4-fluorophenyl)ethyne ($Ar_1$) (17.9945 g, 0.084 Mol), of 2,3-bis(4-fluorophenyl)quinoxaline ($Ar_2$) (26.7406 g, 0.0840 Mol), and 46.44 g (0.336 Mol) of anhydrous, pulverized potassium carbonate were added and rinsed with 350 mL of warm sulfolane and 150 mL of toluene. The reaction mixture was heated until boiling at approximately 135° C., the azeotropic distillation was continued for 2 hours while the temperature of the mixture gradually rose from 135° C. to 180° C. as recovered toluene was gradually removed from Dean-Stark trap. The reaction was continued at 180° C. with constant azeotropic distillation during 18–22 hr. The reaction mixture was diluted with 150 mL of N-methylpyrrolidinone (NMP), filtered hot (approximately 140° C.) and precipitated in 4 Liters of methanol. The precipitate was filtered, washed 3 times with 1 Liter portions of methanol, and dried in a vacuum oven for approximately 48 h at 90–1000° C. until constant weight, giving 94.0 g (yield 96.9%) of the almost uncolored polymer.

Example B2–B13

Preparation of Bis(4-Fluorophenyl)Ethyne, 4,4'-Fluorobenzophenone Polymers

TABLE 2

Non-Fluorinated Poly(Arylene Ether) Polymers: Preparation and Properties

| Polymer ID | Mole Ratio $Ar_1:Ar_2$ | Solvent | t, °C. | Reflux Time h | Yield % | Appearance | $M_p \times 10^{-3}$ | $M_n \times 10^{-3}$ | $M_w \times 10^{-3}$ | Poly-dispersity |
|---|---|---|---|---|---|---|---|---|---|---|
| 1 | 50:50 | Sulfolane + Toluene | 180 | 19.5 | 97.2 | White granules | 24.7 | 7.8 | 31.4 | 4.04 |
| 2 | 0:1 | NMP + toluene | 130 | 6.5 | 95.6 | White Solid | 31.4 | 9.6 | 31.0 | 3.25 |
| 3 | 0:1 | DMAC + Penzene | 130 | 13.5 | 96.6 | White Solid | 36.3 | 9.8 | 38.2 | 3.92 |

TABLE 2-continued

Non-Fluorinated Poly(Arylene Ether) Polymers: Preparation and Properties

| Polymer ID | Mole Ratio $Ar_1:Ar_2$ | Solvent | t, °C. | Reflux Time h | Yield % | Appearance | $M_p \times 10^{-3}$ | $M_n \times 10^{-3}$ | $M_w \times 10^{-3}$ | Poly-dispersity |
|---|---|---|---|---|---|---|---|---|---|---|
| 4 | 0:1 | Sulfolane + Toluene | 180 | 3 | 98.2 | White Strands | 125 | 10.3 | 118 | 11.4 |
| 5 | 10:90 | Sulfolane + Toluene | 180 | 20 | 87.8 | White Solid | 66.8 | 8.2 | 61.9 | 7.59 |
| 6 | 15:85 | Sulfolane + Toluene | 180 | 22.5 | 91.4 | White Strands | 57.3 | 9.1 | 59.6 | 6.57 |
| 7 | 20:80 | Sulfolane + Toluene | 180 | 20.5 | 88.1 | White Solid | 44.9 | 9.1 | 49.2 | 5.41 |
| 8 | 25:75 | Sulfolane + Toluene | 180 | 24 | 96.0 | White Strands | 41.7 | 8.7 | 47.8 | 5.51 |
| 9 | 60:40 | Sulfolane + Toluene | 180 | 20 | 99.7 | White granules | 25.3 | 8.0 | 40.0 | 3.99 |
| 10 | 75:25 | Sulfolane + Toluene | 180 | 24 | 76.1 | White Solid | 16.3 | 6.6 | 20.0 | 3.0 |
| 11 | 1:0 | Sulfolane + Toluene | 180 | 22 | 91.0 | White Solid | 12.5 | 5.3 | 17.5 | 3.3 |
| 12 | 25:75 | Sulfolane + Toluene | 180 | 2 + 20 | >90 | White Solid | 26.3 | 7.5 | 36.9 | 4.9 |
| 13 | 50:50 | Sulfolane + Toluene | 180 | 44 | 97 | White Solid | 11.0 | 5.2 | 15.5 | 3.0 |

Polymer 1 is the polymer of Example B1. Polymers 2, 3, and 4 are all homopolymers of the bis(4-fluorophenyl) ethyne monomer where each polymer was prepared using different solvent systems for the reaction mixture. Polymer 11 is the homopolymer of the 4,4'-fluorobenzophenone monomer and is prepared in a manner analogous to the polymer of Example B1. Polymer 12 has the same ratio of $Ar_1$ to $Ar_2$ as polymer 8, however polymer 12 has a portion of the $Ar_1$ monomer pre-reacted. Polymer 13 has 2,3-bis(4-fluorophenyl)quoxaline replacing the difluorobenzophenone employed as $Ar_2$ in the other polymers.

The effect of the solvent system on the bis(4-fluorophenyl)ethyne homopolymer is shown in polymers 2 and 3 wherein polymer 2 uses a NMP/toluene solvent system, and polymer 3 uses a DMAC/benzene solvent system. The choice of either solvent system does not appear to affect the properties of the resulting homopolymer. However, polymer 4 was polymerized in a sulfolane/benzene solvent system at a higher reflux temperature for a reduced amount of time as compared to polymers 2 and 3. The resulting homopolymer exhibits three times the weight average molecular weight $M_w$, and approximately three times the polydispersity. Notably, the reflux time and temperature does not seem to have a significant effect on the homopolymers synthesize in the NMP/toluene, and the DMAC/benzene solvent systems.

Polymer 11 is the homopolymer of the 4,4'-fluorobenzophenone monomer. Notably the polymer length appears shorter than the copolymers as evidenced by the lower molecular weights $M_n$ and $M_w$.

TABLE 3

| PROPERTY | B1 | B12 | B13 |
|---|---|---|---|
| Organic Content | 100% | 100% | 100% |
| Polymer Purity (9 metals) | <50 ppb | <50 ppb | <50 ppb |
| Cured Film Thickness | 1 μm | 1 μm | 1 μm |
| Film Thickness Uniformity | >99% | >99% | >99% |
| Dielectric Constant MIM parallel plate, 1 MHz | 2.79 | 2.84 | 2.85 |

TABLE 3-continued

| PROPERTY | B1 | B12 | B13 |
|---|---|---|---|
| Refractive Index | | | |
| (in-plane) | 1.6705 | not measured | not measured |
| (out-of-plane) | 1.6645 | | |
| $\Delta\, n_D$ | 0.006 | not measured | not measured |
| Tg | >400° C. | >400° C. | >400° C. |
| Residual Stress | 60 MPa | 60 MPa | 60 MPa |
| Δ Stress 3x (RT-450° C.) Cycles | none | none | none |
| Isothermal Weight Loss | | | |
| @ 450° C., 2 hr | 1% | 1% | <2% |
| @ 425° C., 8 hr | 1.44% | 1.44% | 1.44% |
| Thermal Stability to 400° C. | no out-gassing | no out-gassing | slight @ 380° C. |
| Gap-fill (0.8 μm depth) | <0.13 μm (SiO$_2$) | <0.13 μm (SiO$_2$) | <0.13 μm (SiO$_2$) |
| Planarization over 0.8 μm high metal lines | 84% | not measured | not measured |
| Adhesion, Stud Pull Values | >8 ksi | >8 ksi | >8 ksi |
| Crack Threshold | >2 μm | >2 μm | >2 μm |
| Solvent Resistance (NMP, 90° C., 24 h) | no swelling | no swelling | no swelling |
| Moisture uptake | 0.44% | not measured | not measured |
| Metal Line Corrosion | None | None | None |
| Cure Atmosphere | inert | inert | inert |

In view of the foregoing, it will be understood that embodiments of the present invention have been enabled that advantageously provide poly(arylene ether) polymers that exhibit a Tg in excess of 350° C., a dielectric constant between 2.0 and 3.0, gap-filling capability for gaps of 0.25 μm or less, excellent adhesion to commonly employed surfaces, low stress, little or no out-gassing, excellent planarization of non-planar surfaces, and very low trace metal content. In addition, it will be realized that methods for making the aforementioned polymers have also been provided herein, as well as synthetic methods for producing the key bis(4-fluorophenyl)ethyne monomer. It will be further realized that the use of the aforementioned monomers for interlayer dielectrics in multilayer metal interconnect structures has been demonstrated for semiconductor integrated circuits as well as for multichip modules and other microelectronic devices.

Thus, the poly(arylene ether) composition of Example B1 provides a Tg in excess of 400° C., a dielectric constant of 2.79, less that 50 ppb of trace metals, a residual stress of about 60 Mpa with effectively no change on thermal cycling, no out-gassing below 400° C., gap fill capability equal to or better than 0.13 μm and the ability to achieve an 84% planarization of non-planar surfaces as described above. In some embodiments of the present invention, other poly (arylene ether) polymers have been shown to provide similar characteristics as seen in Tables 2 and 3.

Some embodiments of the present invention enable using the aforementioned polymers as a dielectric material for a microelectronic device such as an IC a PCB or a multichip module. For some embodiments, coating a semiconductor substrate with a film of such aforementioned polymers has been enabled; and for some embodiments use of such aforementioned polymers for multichip modules has been enable.

Thus, it will be evident that embodiments of the present invention have been described that provide solutions for the previously mentioned problems without the use of adhesion promoters and without the presence of reactive fluorine moieties.

It will also be understood that the method of making the polymers contained herein includes an optimal processing approach to attain high-quality thin films through controlled cure under an inert ambient. It will be further understood that the method for making the monomers of the poly (arylene ethers) of this invention includes catalyzed coupling of commercially available pre-monomers to provide novel tolane-type ethynylated aromatic monomers advantageously used in the polymerization method of this invention to make high glass transition temperature poly(arylene ethers).

C. POLYMER APPLICATIONS

Example C1

Preparation of Coating Solution

A 13% solution of a poly(arylene ether) corresponding to Example B1 is prepared by dissolving an appropriate weight of the solid polymer in cyclohexanone under ambient conditions in a glass lined reactor. The solution is then filtered through a series of four Teflon® filtration cartridges. The filtration cartridges have decreasing nominal pore sizes of 1.0, 0.5, 0.2 and 0.1 μm, respectively.

Example C2

Preparation of Film Coated Substrates

Between approximately 3 to 7 milliLiters (mL) of the filtered solution of Example C1 was processed onto the surface of an eight inch silicon wafer using a spin coater and hot plate oven track, for example a Silicon Valley Group, Inc. (SVG) Model No. 8828 coater and SVG Model No. 8840 oven track. The spin-bake-cure recipes employed are in accordance with the recipes previously set forth in Table 1, where the ambient temperature is approximately 22° C. and spin-cup pressure and humidity are 20 to 30 mmHg and 40%, respectively. The various thermochemical and electrical properties of the film so produces are illustrated in table 3, below.

We claim:

1. A poly(arylene ether) having the structure:

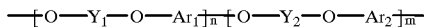

wherein $Y_1$ is a first divalent arylene radical and $Y_2$ is a second divalent arylene radical, each divalent arylene radical selected from a first group consisting of:

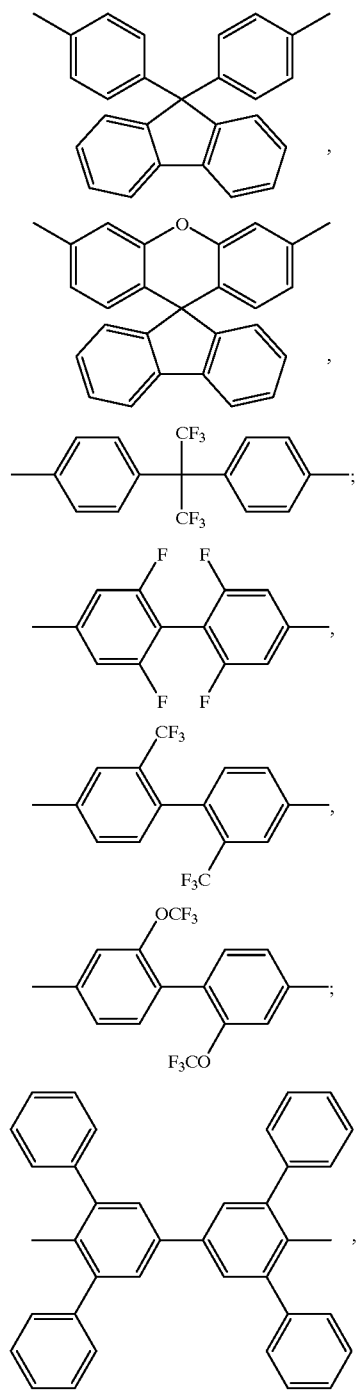

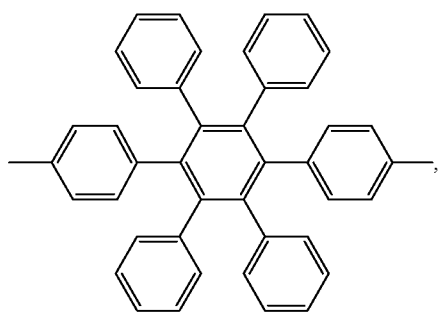
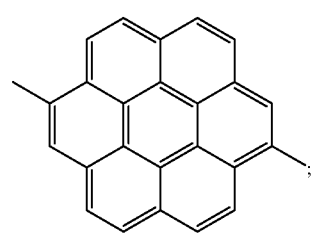
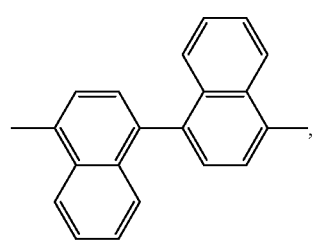
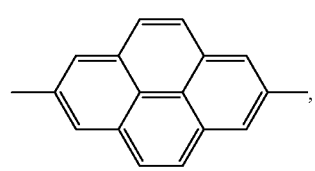
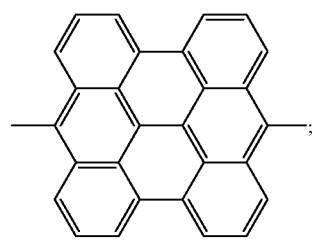
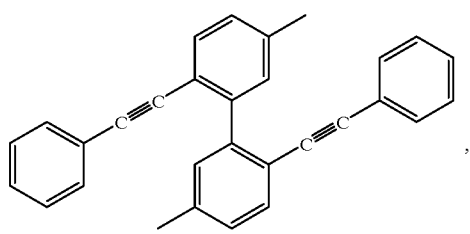
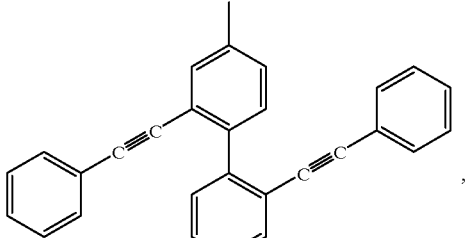
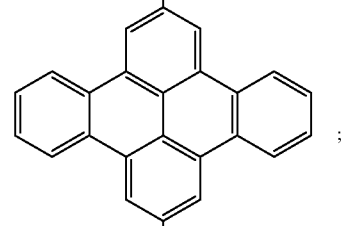
and mixtures thereof, wherein when $Y_1$ and $Y_2$ are both selected to be:
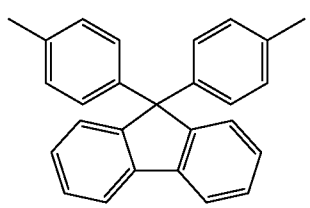
then n=0.1 to 0.9 and m=1−n, else n=0 to 1 and m=1−n; $Ar_1$ is a third divalent arylene radical selected from the second group consisting of:
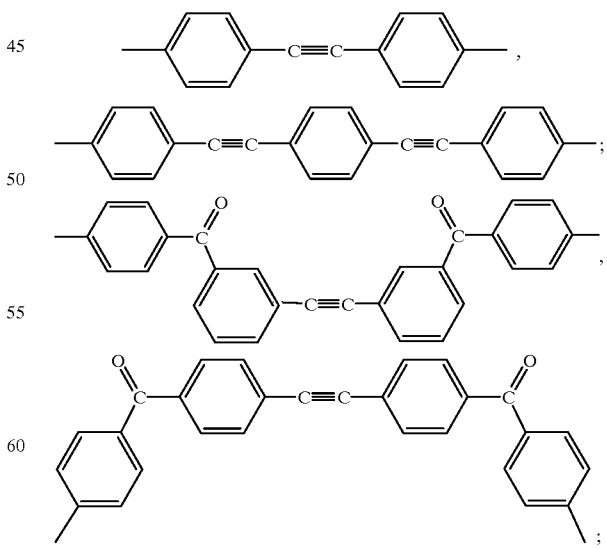

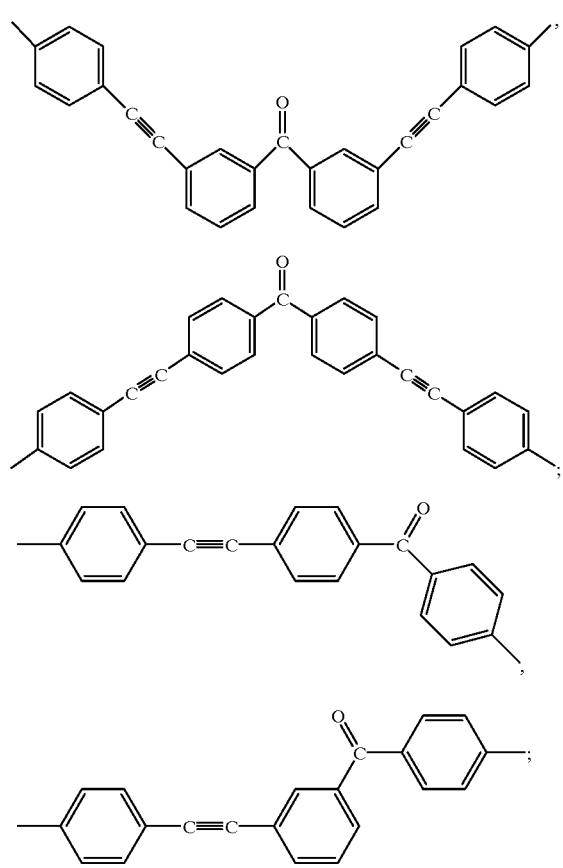
and Ar₂ is a fourth divalent arylene radical selected from the third group consisting of:
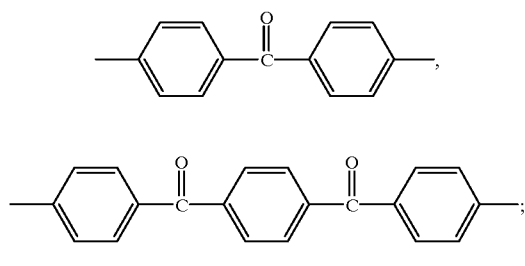
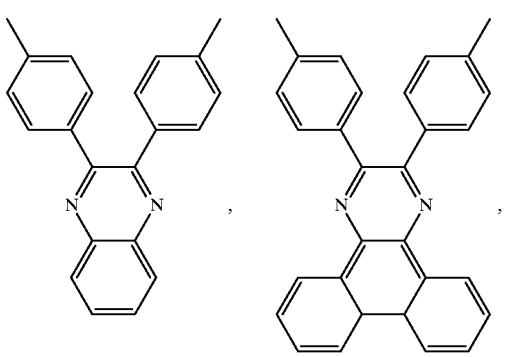
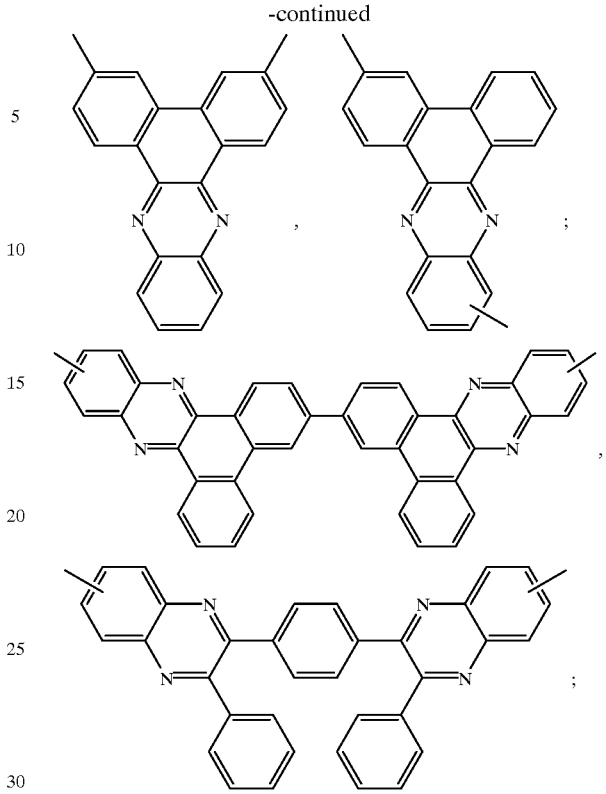
and mixtures thereof.
2. A poly(arylene ether) as in claim 1 wherein: $Y_1$ and $Y_2$ each have the structure:
Ar₁ has the structure
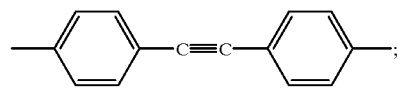
and
Ar₂ has the structure
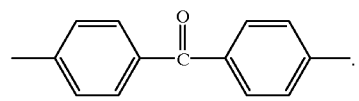
3. A poly(arylene ether) as in claim 2 wherein the ratio n:m is 1:1.
4. A poly(arylene ether) as in claim 2 wherein the ratio n:m is 1:3.

5. A poly(arylene ether) as in claim 2 wherein the structural pairs $Y_1/Ar_1$ and $Y_2/Ar_2$ are essentially randomly ordered within said repeating units.

6. A poly(arylene ether) as in claim 2 wherein the population of structural pair $Y_1/Ar_1$ is higher within said poly(arylene ether) than at ends of said poly(arylene ether).

7. A poly(arylene ether) as in claim 1 wherein:

$Y_1$ and $Y_2$ each have the structure:

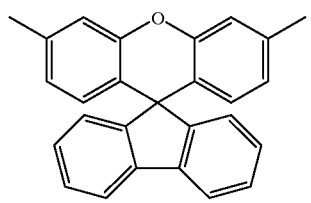

$Ar_1$ has the structure

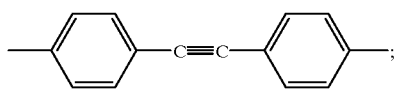

and $Ar_2$ has the structure

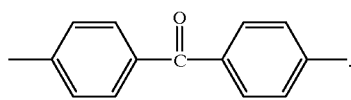

8. A poly(arylene ether) as in claim 7 wherein the population of structural pair $Y_1/Ar_1$ is higher within said poly(arylene ether) than at ends of said poly(arylene ether).

9. A poly(arylene ether) as in claim 7 wherein the ratio n:m is 1:1.

10. A poly(arylene ether) as in claim 7 wherein the ratio n:m is 1:3.

11. A poly(arylene ether) as in claim 1 wherein: $Y_1$ and $Y_2$ each have the structure:

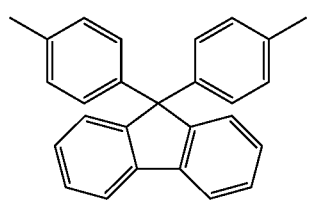

$Ar_1$ has the structure

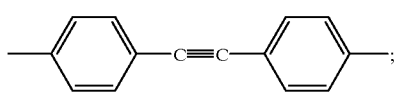

and $Ar_2$ has the structure

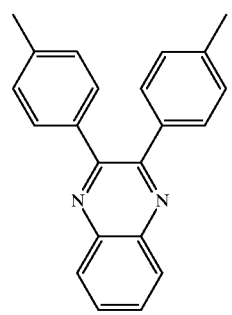

12. A poly(arylene ether) as in claim 11 wherein the ratio n:m is 1:1.

13. A poly(arylene ether) as in claim 1 wherein each divalent arylene radical of said first group is derived from a corresponding bisphenol compound, and each divalent arylene radical of said second and third groups is derived from corresponding difluoro-compound.

14. A method for synthesizing bis(4-fluorophenyl)ethyne comprising the steps of:

charging a first reaction vessel with a first 1-halo-4-fluorobenzene, an ethynyltrialkylsilane, a first catalyst, and a first solvent to provide a first reaction mixture;

heating said first reaction mixture to couple said 1-halo-4-fluorobenzene with said ethynyltrialkylsilane, wherein a 1-fluoro-4-(trialkylsilyl)ethynylbenzene intermediate is provided;

charging a second reaction vessel with said 1-fluoro-4-(trialkylsilyl)ethynylbenzene intermediate, a weak base and a second solvent to provide a second reaction mixture, wherein said weak base acts to desilylate said 1-fluoro-4-(trialkylsilyl)ethynylbenzene intermediate to provide a 1-ethynyl-4-fluorobenzene intermediate;

charging a third reaction vessel with said 1-ethynyl-4-fluorobenzene intermediate, a second catalyst, a second 1-halo-4-fluorobenzene and a third solvent to provide a third reaction mixture; and heating said third reaction mixture to couple said 1-ethynyl-4-fluorobenzene intermediate with said second 1-halo-4-fluorobenzene wherein bis(4-fluorophenyl)ethyne is provided.

15. A method for synthesizing bis(4-fluorophenyl)ethyne as in claim 14 wherein said first and said second 1-halo-4-fluorobenzene are each selected from the group consisting essentially of 1-bromo-4-fluorobenzene, 1-iodo-4-fluorobenzene, and mixtures thereof.

16. A method for synthesizing bis(4-fluorophenyl)ethyne as in claim 15 wherein said first 1-halo-4-fluorobenzene is 1-bromo-4-fluorobenzene, and said second 1-halo-4-fluorobenzene is 1-iodo-4-fluorobenzene.

17. A method for synthesizing bis(4-fluorophenyl)ethyne as in claim 16 wherein said weak base is potassium carbonate ($K_2CO_3$).

18. A method for synthesizing bis(4-fluorophenyl)ethyne as in claim 16 wherein said first and/or said second catalyst is a tetrakis(triarylphosphine) palladium[0].

19. A method for synthesizing bis(4-fluorophenyl)ethyne as in claim 18 wherein said tetrakis(triarylphosphine) palladium[0] is selected from the group consisting of tetrakis(triphenylphosphine) palladium[0] and tetrakis(tri(o-tolyl) phosphine) palladium[0].

20. A method for synthesizing bis(4-fluorophenyl)ethyne as in claim 14 wherein said first and/or said second catalyst is palladium[II]/copper[I] catalyst system comprising a copper[I] halide and either a dichlorobis(triarylphosphine) palladium[II] or a diacetyl bis(triarylphosphine) palladium [II].

21. A method for synthesizing bis(4-fluorophenyl)ethyne as in claim 14 wherein said first and third solvents are each an aprotic solvent.

22. A method for synthesizing bis(4-fluorophenyl)ethyne as in claim 21 wherein said first and third solvent is triethylamine.

23. A process for producing a poly(arylene ether) having the structure:

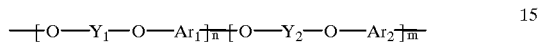

wherein $Y_1$ is a first divalent arylene radical and $Y_2$ is a second divalent arylene radical, each divalent arylene radical selected from a first group consisting of:

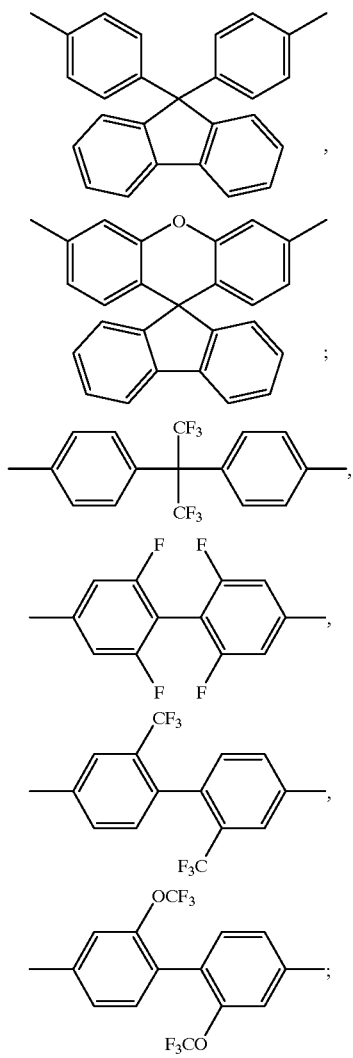

-continued

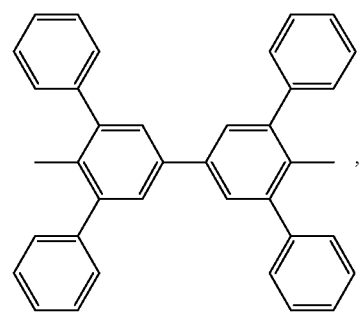

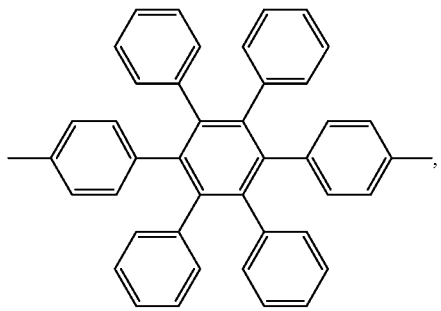

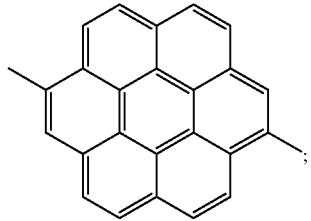

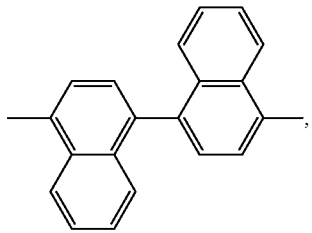

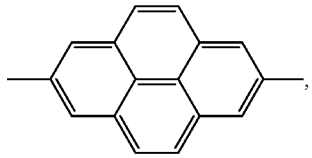

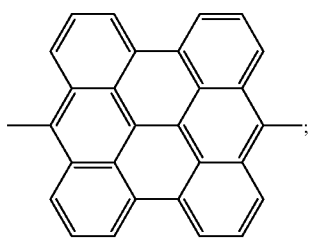

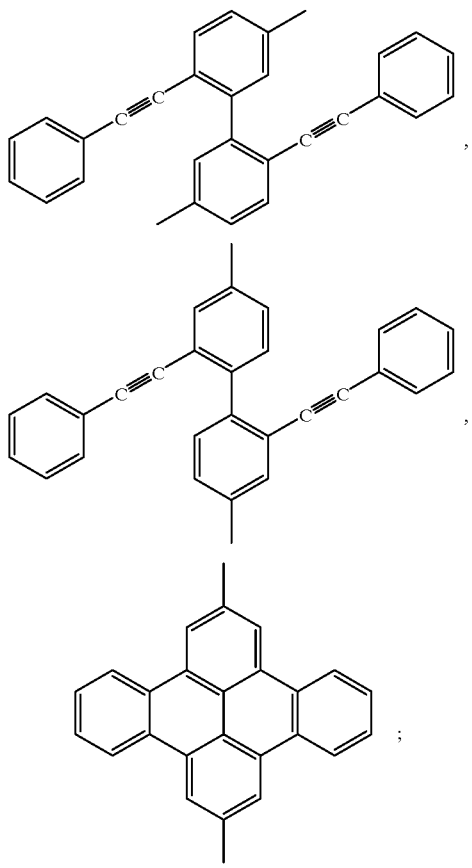
and mixtures thereof, wherein when $Y_1$ and $Y_2$ are both selected to be:
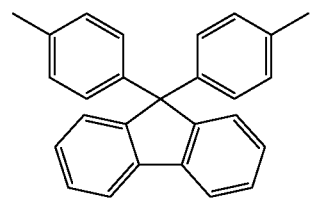
then n=0.1 to 0.9 and m=1−n, else n=0 to 1 and m=1−n; $Ar_1$ is a third divalent arylene radical selected from the second group consisting of:
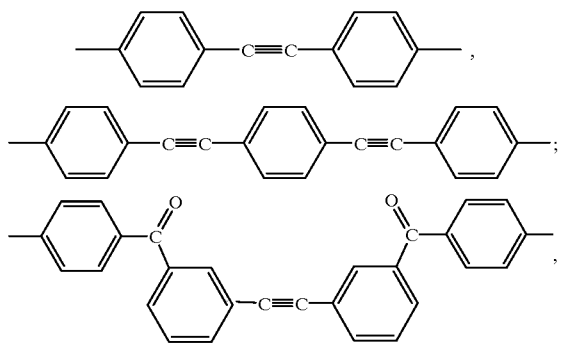
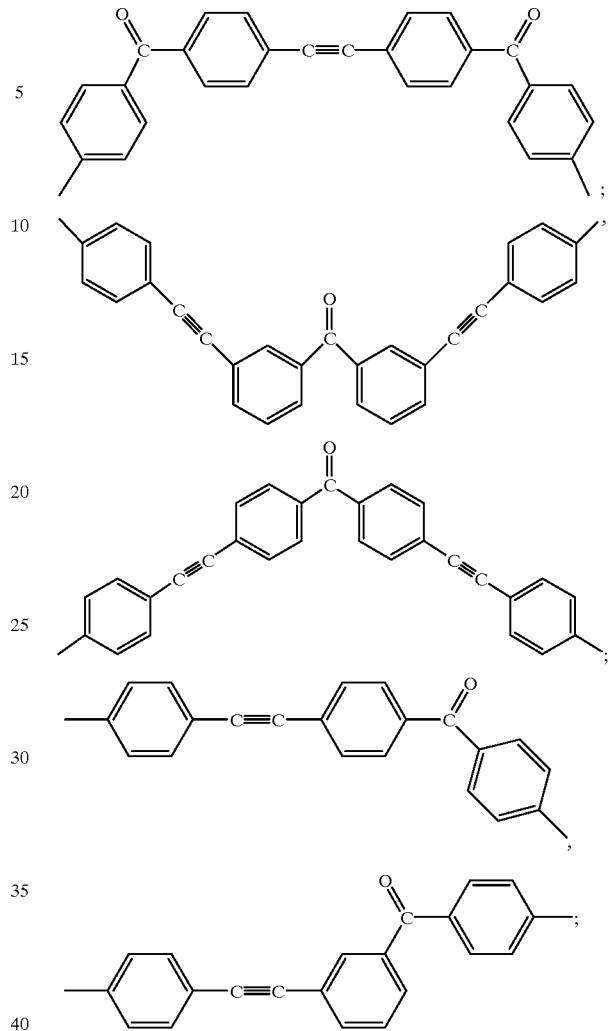
and $Ar_2$ is a fourth divalent arylene radical selected from the third group consisting of:
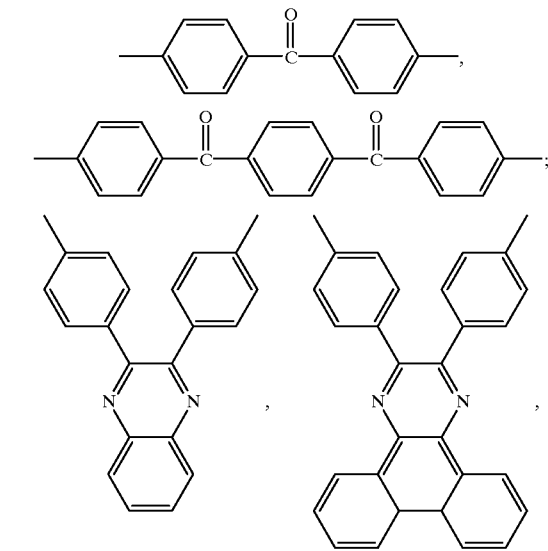

49

-continued

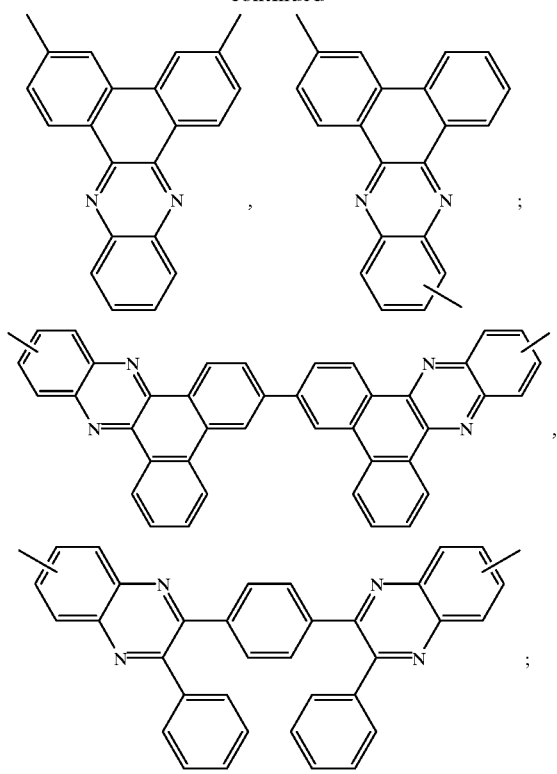

and mixtures thereof, comprising the steps of:
charging a reaction vessel with a first monomer of the structure HO—$Y_1$—OH, a second monomer of the structure HO—$Y_2$—OH, a third monomer of the structure F—$Ar_1$—F, a fourth monomer of the structure F—$Ar_2$—F and an azeotropic solvent, wherein a reaction mixture is provided; and
heating said reaction mixture to provide polymerization of said monomers.

24. A poly(arylene ether) as in claim 23 wherein the structural pairs $Y_1/Ar_1$ and $Y_2/Ar_2$ are essentially randomly ordered within said repeating units.

25. A poly(arylene ether) as in claim 23 wherein the population of structural pair $Y_1/Ar_1$ is higher within said poly(arylene ether) than at ends of said poly(arylene ether).

26. A process for producing a poly(arylene ether) as in claim 23 wherein heating said reaction mixture comprises heating to a first temperature sufficiently high to begin refluxing of said azeotropic solvent.

27. A process for producing a poly(arylene ether) as in claim 26 wherein heating said reaction mixture to a first temperature comprises removing a portion of said refluxing azeotropic solvent via azeotropic distillation, wherein the first temperature is increased to a second temperature.

28. A process for producing a poly(arylene ether) as in claim 23 wherein said azeotropic solvent is a mixture of a first solvent selected from the group consisting essentially of N-methyl-2-pyrrolidinone (NMP), N,N-dimethyl acetamide (DMAC) and sulfolane, and a second solvent selected from the group consisting essentially of toluene, benzene.

29. A process for producing a poly(arylene ether) as in claim 28 wherein said azeotropic solvent is a mixture of sulfolane and toluene.

30. A process for producing a poly(arylene ether) as in claim 23 wherein the reaction vessel is charged with bis(4-fluorophenyl)ethyne, 4,4'-difluorobenzophenone and fluorene bisphenol.

31. A process for producing a poly(arylene ether) as in claim 24 wherein the reaction vessel is charged with bis(4-fluorophenyl)ethyne and 4,4'-difluorobenzophenone having a 1:1 molar ratio.

32. A process for producing a poly(arylene ether) as in claim 24 wherein the reaction vessel is charged with bis(4-fluorophenyl)ethyne and 4,4'-difluorobenzophenone having a 1:3 molar ratio.

33. A process for producing a poly(arylene ether) as in claim 23 wherein the reaction vessel is charged bis(4-fluorophenyl)ethyne and 2,3-bis(4-fluorophenyl)quinoxaline having a 1:1 molar ratio.

34. A process for producing a poly(arylene ether) as in claim 25 wherein the reaction vessel is charged with bis(4-fluorophenyl)ethyne and 4,4'-difluorobenzophenone having a 1:3 molar ratio.

35. A semiconductor device comprising a dielectric layer disposed overlying a surface, wherein said dielectric layer comprises a poly(arylene ether) having repeating units of the structure:

wherein $Y_1$ is a first divalent arylene radical and $Y_2$ is a second divalent arylene radical, each divalent arylene radical selected from a first group consisting of:

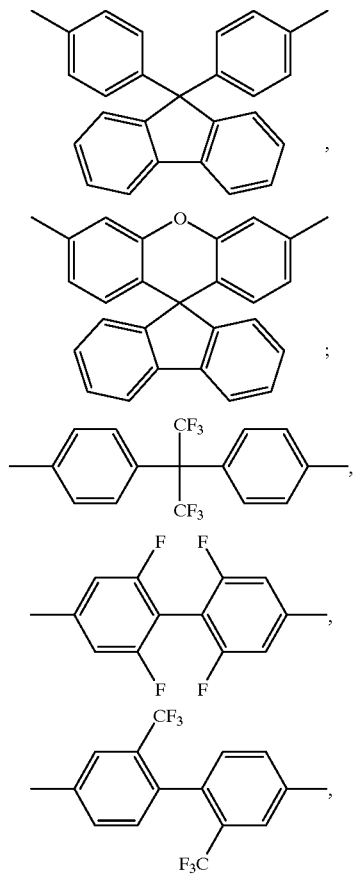

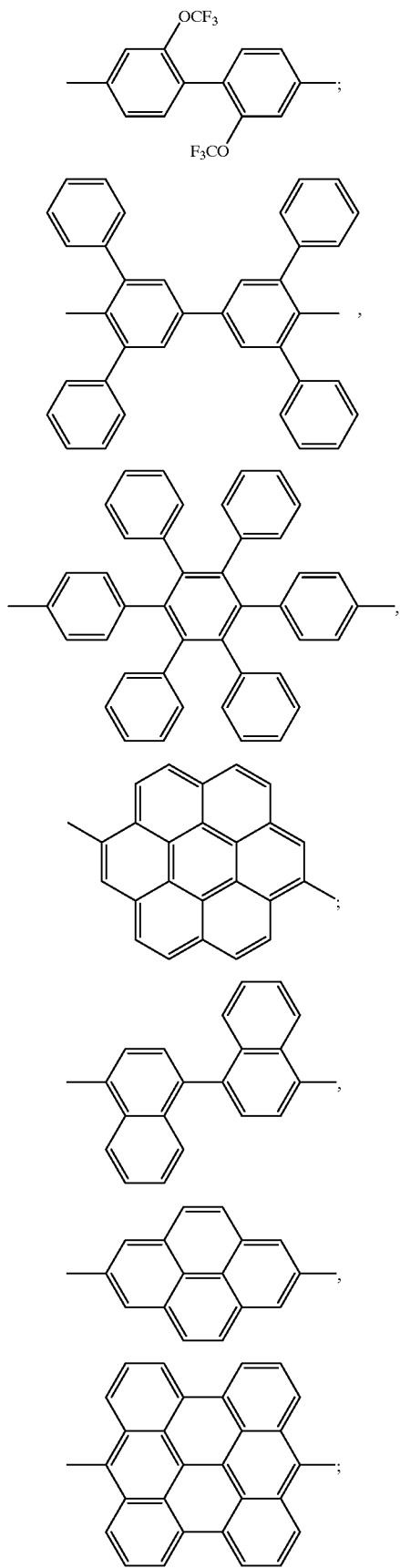
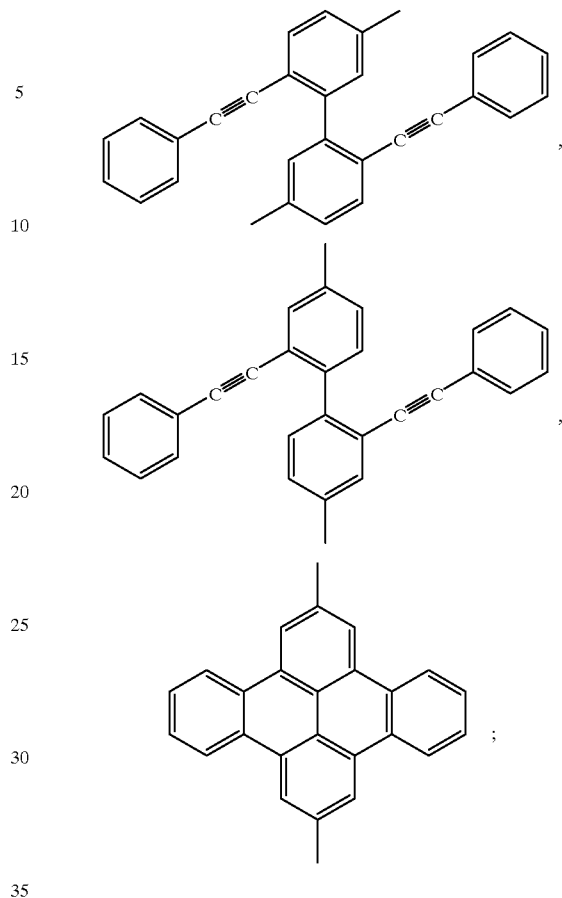
and mixtures thereof, wherein when $Y_1$ and $Y_2$ are both selected to be:
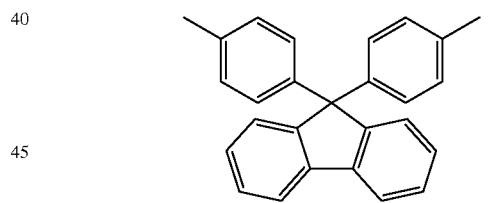
then n=0.1 to 0.9 and m=1−n, else n=0 to 1 and m=1−n; $Ar_1$ is a third divalent arylene radical selected from the second group consisting of:
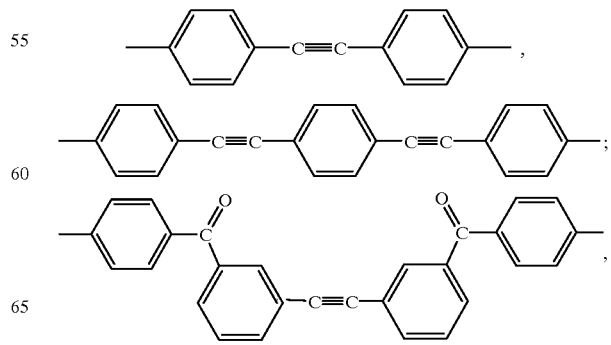

53
-continued

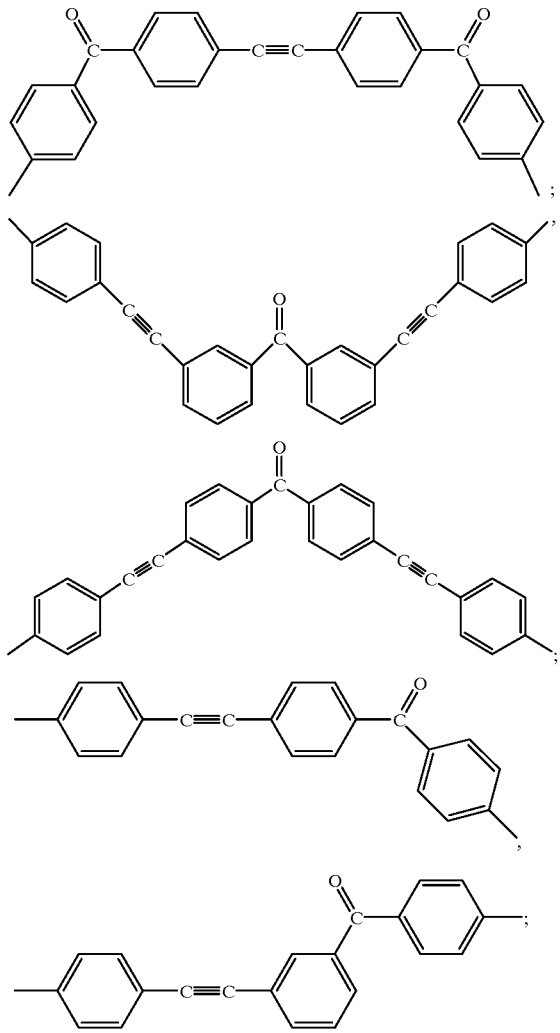

and Ar$_2$ is a fourth divalent arylene radical selected from the third group consisting of:

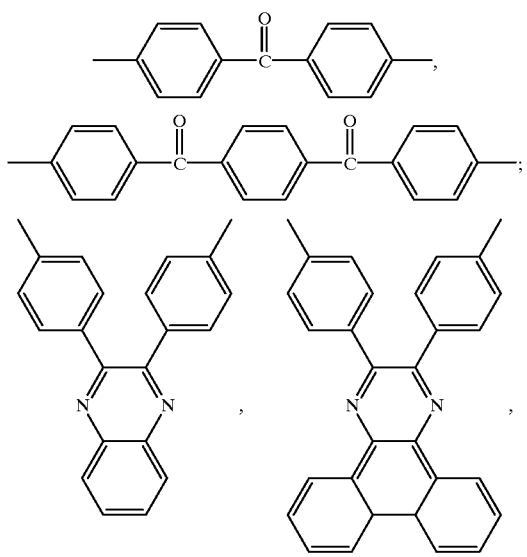

54
-continued

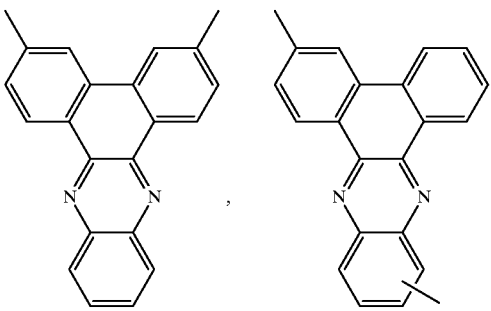

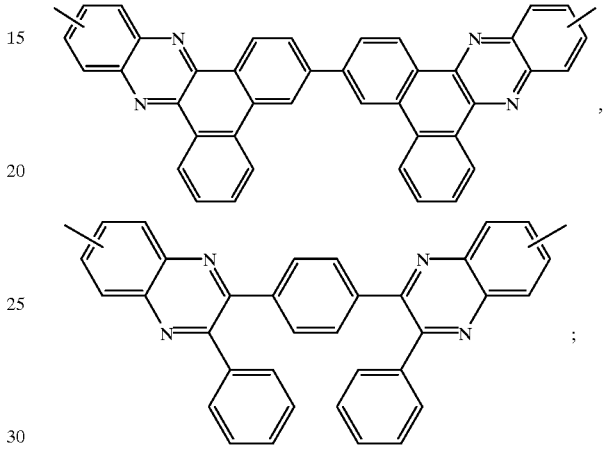

and mixtures thereof.

36. A semiconductor integrated circuit comprising a dielectric layer, as in claim 35 wherein said surface comprises silicon oxide and/or aluminum, and wherein said dielectric layer has an adhesion of at least 7,500 pounds per square inch to said surface, a dielectric constant less than 3.0 and a glass transition temperature of at least 350° C.

37. A semiconductor integrated circuit comprising a dielectric layer, as in claim 36 wherein said dielectric layer has a film thickness uniformity of at least 99 percent and a gap fill ability, for gaps having a depth of up to 0.8 micron, of less than or equal to 0.25 micron.

38. A semiconductor integrated circuit comprising a dielectric layer, as in claim 35 wherein:

Y$_1$ and Y$_2$ of said poly(arylene ether) each have the structure:

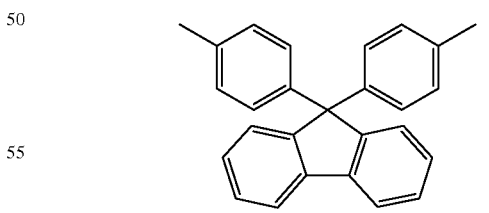

Ar$_1$ of said poly(arylene ether) has the structure

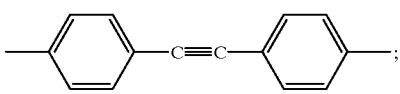

and

Ar₂ of said poly(arylene ether) has the structure

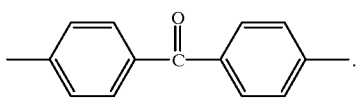

39. A semiconductor integrated circuit comprising a dielectric layer, as in claim 38 wherein said poly(arylene ether) has a ratio n:m equal to 1:1.

40. A semiconductor integrated circuit comprising a dielectric layer, as in claim 39 wherein said surface comprises silicon oxide and/or aluminum, and wherein said dielectric layer has an adhesion of at least 8,000 pounds per square inch to said surface, a dielectric constant less than 3.0 and a glass transition temperature of at least 400° C.

41. A semiconductor integrated circuit comprising a dielectric layer, as in claim 40 wherein said dielectric layer has a film thickness uniformity of at least 99 per cent and a gap fill ability, for gaps having a depth of up to 0.8 micron, of less than or equal to 0.13 micron.

42. A semiconductor integrated circuit comprising a dielectric layer, as in claim 38 wherein said poly(arylene ether) has a ratio n:m equal to 1:3.

43. A poly(arylene ether) as in claim 42 wherein the population of structural pair $Y_1/Ar_1$ is higher within said poly(arylene ether) than at ends of said poly(arylene ether).

44. A semiconductor integrated circuit comprising a dielectric layer, as in claim 35 wherein:

$Y_1$ and $Y_2$ of said poly(arylene ether) each have the structure:

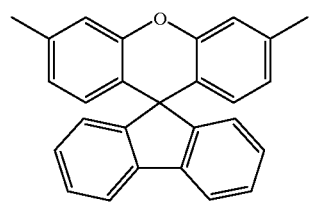

$Ar_1$ of said poly(arylene ether) has the structure

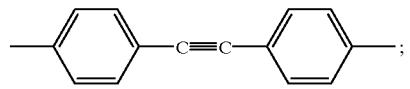

and $Ar_2$ of said poly(arylene ether) has the structure

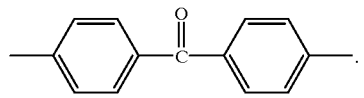

45. A semiconductor integrated circuit comprising a dielectric layer, as in claim 35 wherein each of said first and second divalent arylene radicals, $Y_1$ and $Y_2$ respectively, is derived from a corresponding bisphenol compound and each of said third and fourth divalent arylene radicals, $Ar_1$ and $Ar_2$ respectively, is derived from the corresponding difluoro-compound.

* * * * *